United States Patent
Matsuda et al.

(10) Patent No.: US 8,410,482 B2
(45) Date of Patent: Apr. 2, 2013

(54) SEMICONDUCTOR DEVICE, LIGHT EMITTING APPARATUS AND ELECTRONIC DEVICE

(75) Inventors: Kunihiro Matsuda, Hachioji (JP); Hiroshi Matsumoto, Higashiyamato (JP); Yukikazu Tanaka, Fussa (JP)

(73) Assignee: Casio Computer Co., Ltd., Tokyo (JP)

( * ) Notice: Subject to any disclaimer, the term of this patent is extended or adjusted under 35 U.S.C. 154(b) by 50 days.

(21) Appl. No.: 13/075,411

(22) Filed: Mar. 30, 2011

(65) Prior Publication Data
US 2011/0241002 A1    Oct. 6, 2011

(30) Foreign Application Priority Data
Mar. 31, 2010  (JP) ................................. 2010-080460

(51) Int. Cl.
H01L 29/04 (2006.01)
H01L 29/76 (2006.01)
H01L 21/02 (2006.01)
H01L 31/062 (2012.01)
G11C 21/00 (2006.01)

(52) U.S. Cl. .......... 257/59; 257/288; 257/289; 257/290; 365/76

(58) Field of Classification Search .................... 257/83, 257/184, 257, 290
See application file for complete search history.

(56) References Cited

U.S. PATENT DOCUMENTS

| 5,334,859 | A * | 8/1994 | Matsuda .......................... 257/57 |
| 5,367,179 | A * | 11/1994 | Mori et al. ....................... 257/59 |
| 6,756,641 | B2 * | 6/2004 | Lu ................................... 257/350 |
| 6,891,195 | B2 * | 5/2005 | Yamazaki et al. .............. 257/59 |
| 7,049,636 | B2 * | 5/2006 | Weaver et al. .................. 257/83 |
| 7,161,193 | B2 * | 1/2007 | Kawata et al. ................. 257/184 |
| 2004/0263441 | A1 * | 12/2004 | Tanaka et al. .................. 345/76 |
| 2007/0236640 | A1 * | 10/2007 | Kimura .......................... 349/141 |
| 2010/0181572 | A1 * | 7/2010 | Lee et al. ........................ 257/59 |

FOREIGN PATENT DOCUMENTS

| JP | 10-289910 A | 10/1998 |
| JP | 2001-264818 A | 9/2001 |

* cited by examiner

*Primary Examiner* — Long Tran
*Assistant Examiner* — Dzung Tran
(74) *Attorney, Agent, or Firm* — Holtz, Holtz, Goodman & Chick, P.C.

(57) ABSTRACT

Disclosed in a semiconductor device including a substrate, a first transistor, a second transistor, and a first source electrode and a first drain electrode of the first transistor are arranged along a first direction and a second source electrode and a second drain electrode of the second transistor are arranged in a reverse order of the first source electrode and the first drain electrode along the first direction, the first source electrode and the second source electrode are connected by a source connecting wiring, the first drain electrode and the second drain electrode are connected by a drain connecting wiring, a first gate electrode and a second gate electrode are connected by a gate connecting wiring and the source connecting wiring and the drain connecting wiring are provided at positions except a region overlapped with the first gate electrode, the second gate electrode and the gate connecting wiring.

19 Claims, 16 Drawing Sheets

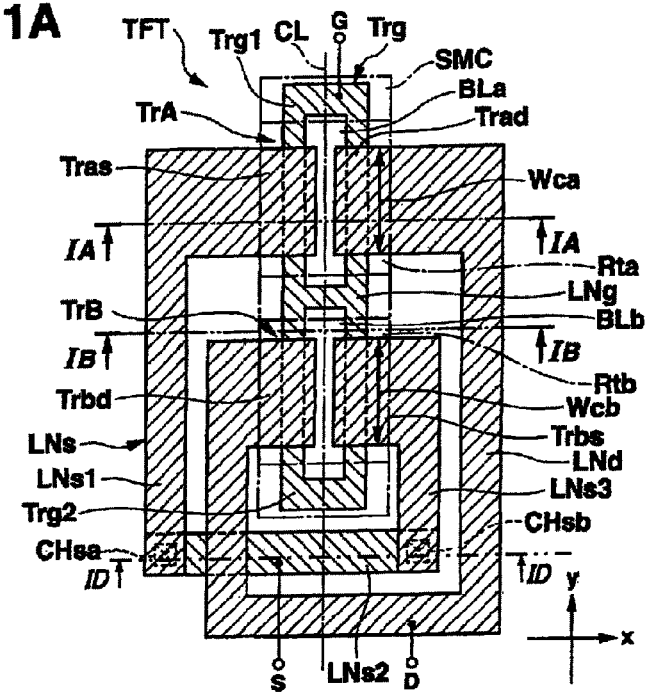
FIG.1A
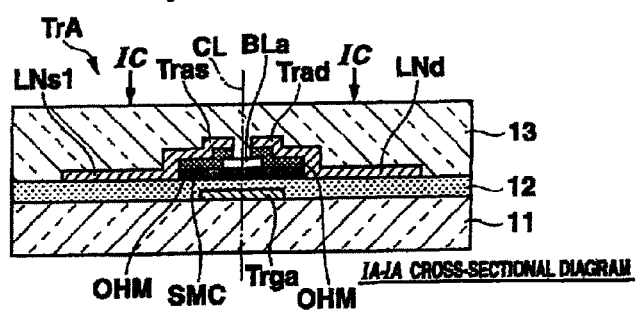
FIG.1B — IA-IA CROSS-SECTIONAL DIAGRAM
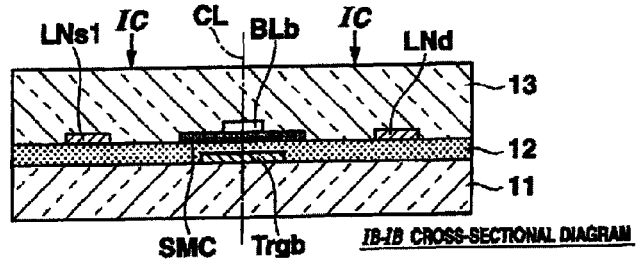
FIG.1C — IB-IB CROSS-SECTIONAL DIAGRAM
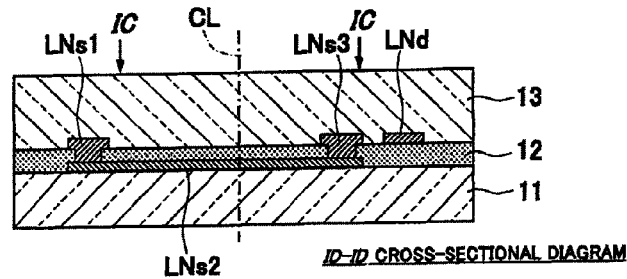
FIG.1D — ID-ID CROSS-SECTIONAL DIAGRAM

IIIB-IIIB CROSS-SECTIONAL DIAGRAM

FIG.5A  FIG.5B  FIG.5C
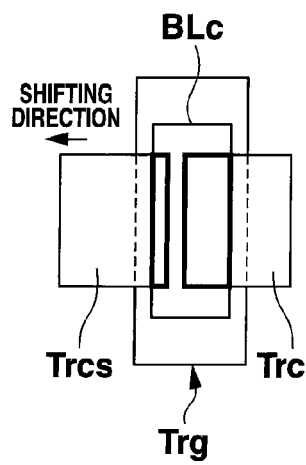
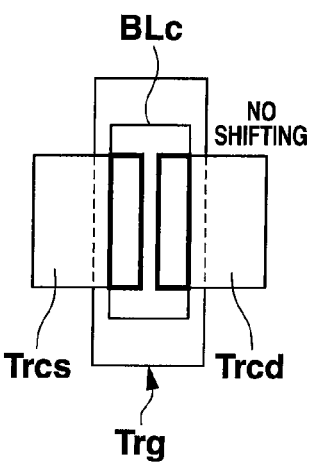
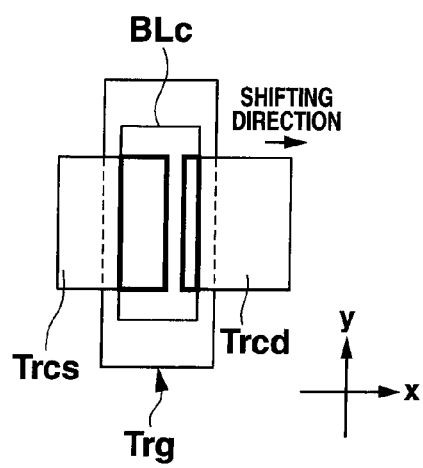
FIG.5D
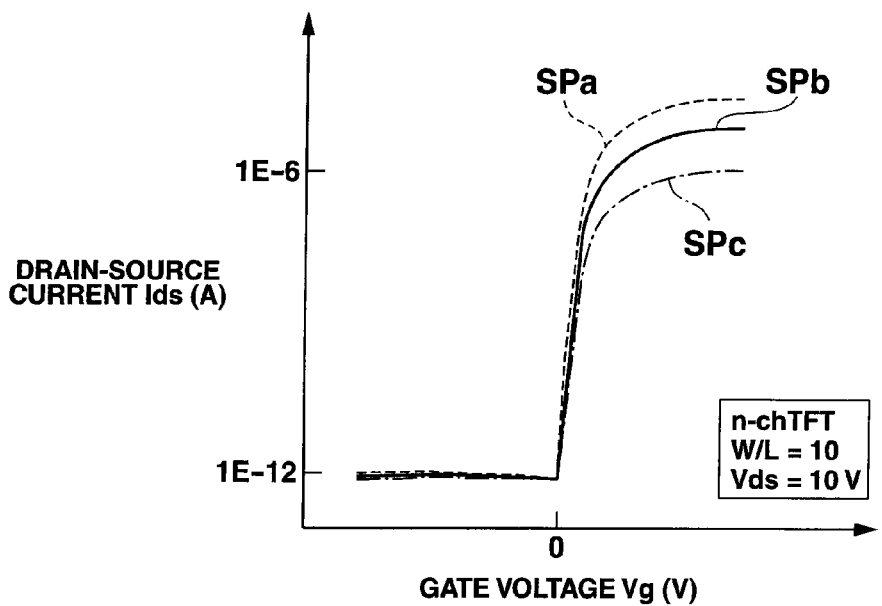

FIG.6A AMOUNT OF MISALIGNMENT (MINUS DIRECTION)

FIG.6B AMOUNT OF MISALIGNMENT = 0

FIG.6C AMOUNT OF MISALIGNMENT (PLUS DIRECTION)

FIG.10A

| AMOUNT OF MISALIGNMENT (μm) | -1 | -0.5 | 0 | 0.5 | 1 |
|---|---|---|---|---|---|
| COMPARISON EXAMPLE Id (μA) | 3.5 | 4.0 | 4.6 | 5.5 | 6.9 |
| PRESENT INVENTION Id (μA) | 5.1 | 4.8 | 4.6 | 4.8 | 5.1 |

FIG.10B

| AMOUNT OF MISALIGNMENT (μm) | -1 | -0.5 | 0 | 0.5 | 1 |
|---|---|---|---|---|---|
| COMPARISON EXAMPLE STANDARDIZED Id (μA) | 0.76 | 0.87 | 1.00 | 1.20 | 1.50 |
| PRESENT INVENTION STANDARDIZED Id (μA) | 1.11 | 1.04 | 1.00 | 1.04 | 1.11 |

SEMICONDUCTOR DEVICE, LIGHT EMITTING APPARATUS AND ELECTRONIC DEVICE

CROSS REFERENCE TO RELATED APPLICATIONS

This application is based upon and claims the benefit of priority under 35 USC 119 of Japanese Patent Application No. 2010-080460 filed on Mar. 31, 2010, the entire disclosure of which, including the description, claims, drawings, and abstract, is incorporated herein by reference in its entirety.

BACKGROUND OF THE INVENTION

1. Field of the Invention

The present invention relates to a semiconductor device, a light emitting apparatus and an electronic device. The present invention particularly relates to a semiconductor device having thin film transistors of an inverted-stagger structure on an insulating substrate, a light emitting apparatus in which the semiconductor devices are applied and an electronic device equipped with the light emitting apparatus.

2. Description of the Related Art

In recent years, a flat-type display such as a liquid crystal display device, an organic electroluminescence (EL) display, a plasma display and the like are used as displays and monitors of portable devices such as a cellular phone, a digital camera and the like and electronic devices such as a television, a personal computer and the like to a great extent.

In such flat-type display, an active matrix drive method is generally applied and a panel structure in which thin film transistor devices using silicon thin films as channel layers are provided on an insulating substrate such as glass is applied in general as the display panel and the driver thereof.

As for the thin film transistor to be provided on the insulating substrate, various types of device structures are known. For example, JP10-289910 and the like describe the thin film transistor having a channel stopper type inverted-stagger structure (or a bottom gate structure) in which a gate electrode is disposed on the lower layer side of a semiconductor layer, a channel protecting layer is provided to cover over the region which is to be the channel layer of the semiconductor layer and a source electrode and a drain electrode are provided on the semiconductor layer and a portion of the source electrode and the drain electrode overlapped on the channel protecting layer.

Further, for example, JP2001-264818 and the like describe that misalignment of the source electrode and the drain electrode occurs with respect to the channel protecting layer when forming the source electrode and the drain electrode on the semiconductor layer by patterning in the above described thin film transistor having the inverted-stagger structure (or the bottom gate structure).

When the misalignment of the source electrode and the drain electrode occurs with respect to the channel protecting layer in the above described thin film transistor having the inverted-stagger structure, the ON currents of the thin film transistors vary. Therefore, when such thin film transistors are applied as the display panel, the switching device of the driver and the driving element of the flat-type display, the display image quality is degraded and the product yield is reduced due to the misalignment.

More in particular, in the case in which the thin film transistors are used as the driving elements in the pixels each of which including the current driven light emitting device (for example, organic EL device) and the driving element for driving the light emitting device to emit light, when the current values of the light emitting drive currents which are to be supplied to the light emitting devices vary due to the misalignments, the pixels cannot be driven to emit light at the desired luminance tone. Therefore, for example, in the display including the display panel in which a plurality of pixels (light emitting devices) are two dimensionally arranged, the entire screen cannot be made to emit light at a uniform luminance. Therefore, the display image quality is degraded and the product yield is reduced.

BRIEF SUMMARY OF THE INVENTION

The present invention has an advantage of providing a semiconductor devices which can suppress the variation in the ON currents of the thin film transistors due to the misalignments of the source electrodes and the drain electrodes, a light emitting apparatus which uses the semiconductor devices to obtain a good display image quality and improve the product yield and an electronic device equipped with the light emitting apparatus.

A semiconductor device of the present invention for obtaining the above advantage includes a substrate, a first transistor provided on an upper surface of the substrate including a first source electrode, a first drain electrode and a first gate electrode, a second transistor provided on the upper surface of the substrate including a second source electrode, a second drain electrode and a second gate electrode, a source connecting wiring to electrically connect the first source electrode and the second source electrode, a drain connecting wiring to electrically connect the first drain electrode and the second drain electrode and a gate connecting wiring to electrically connect the first gate electrode and the second gate electrode, and the first source electrode and the first drain electrode are arranged along a first direction and the second source electrode and the second drain electrode are arranged in a reverse order of the first source electrode and the first drain electrode along the first direction, and the source connecting wiring and the drain connecting wiring are provided at positions except a region overlapped with the first gate electrode, the second gate electrode and the gate connecting wiring.

A light emitting apparatus of the present invention for obtaining the above advantage includes a plurality of pixels arranged on a substrate, and each of the pixels including a light emitting device and a drive device which is connected to the light emitting device to drive the light emitting device, the drive device includes a first transistor provided on an upper surface of the substrate including a first source electrode, a first drain electrode and a first gate electrode, a second transistor provided on the upper surface of the substrate including a second source electrode, a second drain electrode and a second gate electrode, a source connecting wiring to electrically connect the first source electrode and the second source electrode, a drain connecting wiring to electrically connect the first drain electrode and the second drain electrode and a gate connecting wiring to electrically connect the first gate electrode and the second gate electrode, and the first source electrode and the first drain electrode are arranged along a first direction and the second source electrode and the second drain electrode are arranged in a reverse order of the first source electrode and the first drain electrode along the first direction, and the source connecting wiring and the drain connecting wiring are provided at positions except a region overlapped with the first gate electrode, the second gate electrode and the gate connecting wiring.

An electronic device of the present invention for obtaining the above advantage includes an electronic device main body and a light emitting apparatus to which image data is supplied from the electronic device main body and which is driven according to the image data, and the light emitting apparatus comprises a substrate and a plurality of pixels arranged on an upper surface of the substrate, each of the pixels including a light emitting device and a drive device which drives the light emitting device, the drive device includes a first transistor provided on an upper surface of the substrate including a first source electrode, a first drain electrode and a first gate electrode, a second transistor provided on the upper surface of the substrate including a second source electrode, a second drain electrode and a second gate electrode, a source connecting wiring to electrically connect the first source electrode and the second source electrode, a drain connecting wiring to electrically connect the first drain electrode and the second drain electrode and a gate connecting wiring to electrically connect the first gate electrode and the second gate electrode, and the first source electrode and the first drain electrode are arranged along a first direction and the second source electrode and the second drain electrode are arranged in a reverse order of the first source electrode and the first drain electrode along the first direction, and the source connecting wiring and the drain connecting wiring are provided at positions except a region overlapped with the first gate electrode, the second gate electrode and the gate connecting wiring.

BRIEF DESCRIPTION OF THE SEVERAL VIEWS OF THE DRAWING

The above and other objects, advantages and features of the present invention will become more fully understood from the detailed description given hereinbelow and the appended drawings which are given by way of illustration only, and thus are not intended as a definition of the limits of the present invention, and wherein:

FIG. 1A is a schematic plan view of a semiconductor device of the configuration example;

FIG. 1B is a schematic cross-sectional view of the semiconductor device of the configuration example;

FIG. 1C is a schematic cross-sectional view of the semiconductor device of the configuration example;

FIG. 1D is a schematic cross-sectional view of the semiconductor device of the configuration example;

FIG. 5A is a schematic plan view of a thin film transistor of the comparison example;

FIG. 5B is a schematic plan view of the thin film transistor of the comparison example;

FIG. 5C is a schematic plan view of the thin film transistor of the comparison example;

FIG. 5D is a diagram showing a change in device characteristic of the thin film transistor of the comparison example;

FIG. 6A is a schematic plan view of the thin film transistor when a source electrode and a drain electrode are shifted in a minus direction with respect to a channel protecting layer;

FIG. 6B is a schematic plan view of the thin film transistor when the misalignment of the source electrode and the drain electrode does not occur;

FIG. 6C is a schematic plan view of the thin film transistor when the source electrode and the drain electrode are shifted in a plus direction with respect to the channel protecting layer;

FIG. 10A is a diagram showing a comparison result of the drain-source currents with respect to the amounts of misalignment of the source electrode and the drain electrode between the configuration example of the present invention and the comparison example;

FIG. 10B is a diagram showing a comparison result of the drain-source currents with respect to the amounts of misalignment of the source electrode and the drain electrode between the configuration example of the present invention and the comparison example;

DETAILED DESCRIPTION OF THE INVENTION

Hereinafter, a semiconductor device, a light emitting device and an electronic device according to the present invention will be described in detail by showing embodiments embodiments.

<Semiconductor Device>

First, a basic structure of a semiconductor device according to the present invention will be described with reference to the drawings.

FIGS. 1A, 1B, 1C and 1D are schematic configuration diagrams showing an example (hereinafter, indicated as "configuration example") of a basic structure of the semiconductor device according to the present invention.

FIG. 1A is a schematic plan view of the semiconductor device according to the configuration example.

Here, in the plan view shown in FIG. 1A, the right-left direction in the diagram is indicated as x direction and the up-down direction in the diagram is indicated as y direction (the same applies hereinafter) for convenience of description.

FIG. 1B shows a cross-section cut along the line IA-IA (in the specification, "I" is used for descriptive purpose as a symbol corresponding to the roman numeral "1" shown in FIG. 1A) in the semiconductor device having the plan layout shown in FIG. 1A.

FIG. 1C shows a cross-section cut along the line IB-IB in the semiconductor device having the plan layout shown in FIG. 1A. FIG. 1D shows a cross-section cut along the line ID-ID in the semiconductor device having the plan layout shown in FIG. 1A.

Here, in FIGS. 1A, 1B and 1C, electrodes of transistors which are applied in the semiconductor device are shown in the center and connecting wirings with external portions, insulating films between wiring layers and the like are omitted.

Figure 2A:
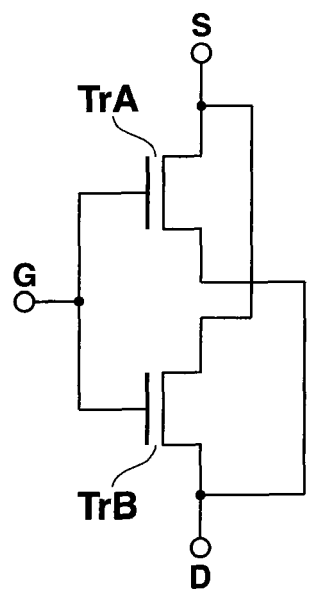
FIG. 2A is a diagram showing an equivalent circuit of a transistor which is applied in the semiconductor device of the configuration example.
Figure 2B:
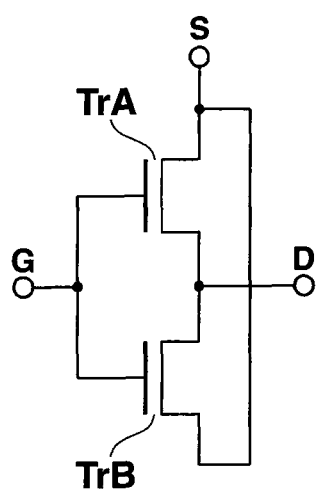
FIG. 2B is a diagram showing an equivalent circuit of a transistor which is applied in the semiconductor device of the configuration example.

FIGS. 2A and 2B are diagrams showing equivalent circuits of the transistors which are applied in the semiconductor device according to the configuration example.

Figure 3:
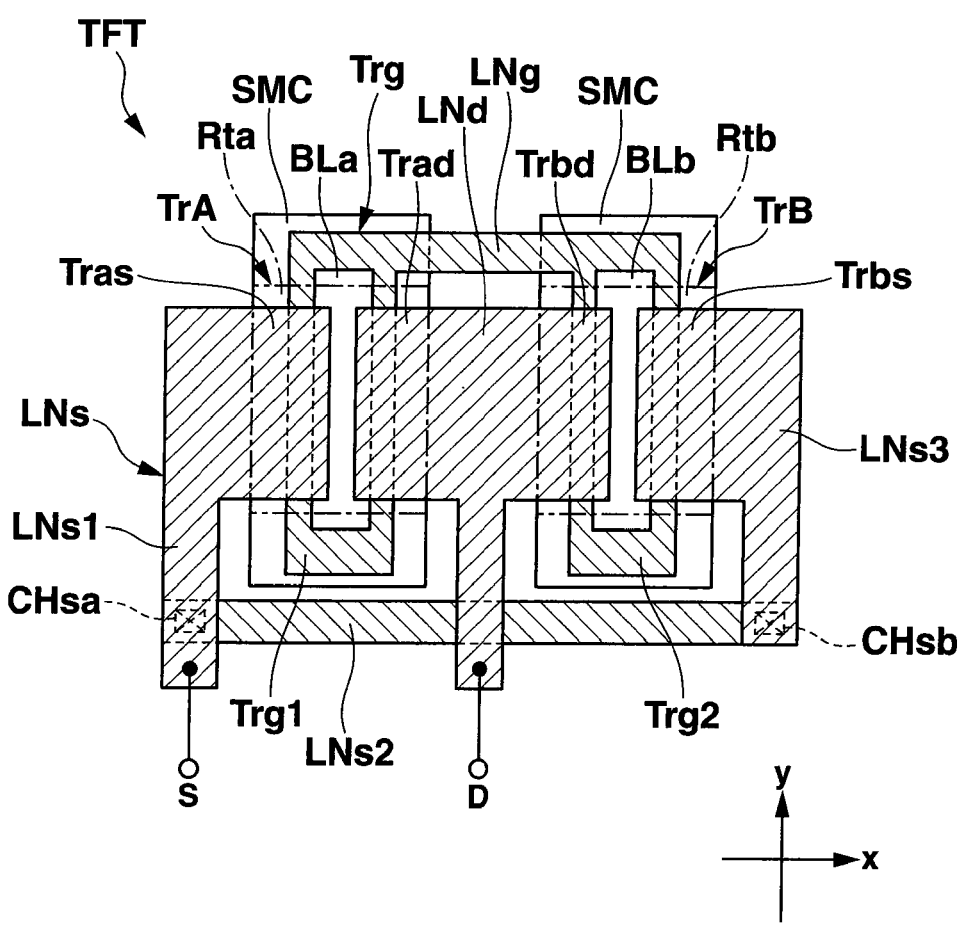
FIG. 3 is a schematic configuration diagram showing another example of a basic structure of the semiconductor device of the present invention.

FIG. 3 is a schematic configuration diagram showing an example of another basic structure of the semiconductor device of the present invention.

As shown in FIGS. 1A, 1B and 1C, in the transistor TFT which is applied to the semiconductor device according to the configuration example, a thin film transistor (a first transistor) TrA and a thin film transistor (a second transistor) TrB having the channel-stopper type inverted-stagger structure are respectively provided in transistor forming regions Rta and Rtb which are provided side by side in a specific direction (in y direction which is the up-down direction in the diagram in FIG. 1A) on the insulating substrate 11 so as to be adjacent to each other. Further, the transistor TFT includes a single conductor layer which is provided so as to extend in the specific direction on the insulating substrate 11 and which forms a gate electrode Trg of the both transistors by being provided so as to astride the transistor forming regions Rta and Rtb. The thin film transistors TrA and TrB has a device structure in which the respective gate electrodes Trg1 and Trg2 are connected by the gate electrode Trg formed of the single conductor layer. Here, the region between the transistor forming regions Rta and Rtb of the gate electrode Trg formed of the single conductor layer is set to the gate connecting wiring LNg. That is, the gate electrode of the thin film transistor TrA and the gate electrode of the thin film transistor TrB are connected to each other via the connecting wiring LNg.

That is to say, the gate electrode Trg includes the first gate electrode Trg1 of the thin film transistor TrA, the second gate electrode Trg2 of the thin film transistor TrB and the gate connecting wiring LNg. The first gate electrode Trg1 of the thin film transistor TrA is arranged inside the transistor forming region Rta, the second gate electrode Trg2 of the thin film transistor TrB is arranged inside the transistor forming region Rtb, and the gate connecting wiring LNg is arranged between the transistor forming regions Rta and Rtb. The first gate electrode Trg1, the second gate electrode Trg2 and the gate connecting wiring LNg are connected so as to form a seamless whole. The first gate electrode Trg1, the second gate electrode Trg2 and the gate connecting wiring LNg are integrally formed. The first gate electrode Trg1, the second gate electrode Trg2 and the gate connecting wiring LNg are integrated to form the gate electrode Trg.

As shown in FIGS. 1A and 1B, the thin film transistor TrA includes the gate electrode (the first gate electrode) Trg1, a gate insulating film 12, a semiconductor layer SMC, a channel protecting layer BLa, an impurity layer OHM, a source electrode (a first source electrode) Tras and a drain electrode (a first drain electrode) Trad. Each of the source electrode Tras and the drain electrode Trad is an electrode provided over the impurity layer OHM on the semiconductor layer SMC.

The thin film transistor TrB also has a cross-sectional structure similar to that of the thin film transistor TrA, and the thin film transistor TrB includes the gate electrode (a second date electrode) Trg2, a gate insulating film 12, a semiconductor layer SMC, a channel protecting layer BLb, an impurity layer OHM, a source electrode (a second source electrode) Trbs and a drain electrode (a second drain electrode) Trbd. Each of the source electrode Trbs and the drain electrode Trbd is an electrode provided over the impurity layer OHM on the semiconductor layer SMC.

The gate electrode Trg1, the gate electrode Trg2 and the gate connecting wiring LNg are provided on one surface side of the insulating substrate 11 and are covered with the gate insulating film 12.

The semiconductor layer SMC on which channel regions are to be formed is provided on the gate insulating film 12 at the region corresponding to the transistor forming regions Rta and Rtb including the region above the gate electrode Trg.

The channel protecting layers BLa and BLb are provided on the semiconductor layer SMC.

The source electrode Tras and the drain electrode Trad of the thin film transistor TrA are arranged along a predetermined direction (x direction) which is orthogonal to the specific direction so as to have a gap between each other and to face each other. The source electrode Tras and the drain electrode Trad are respectively provided at the end sides on the upper surface of the semiconductor layer SMC along the predetermined direction, and a portion of the source electrode Tras and a portion of the drain electrode Trad are respectively provided so as to extend onto portions at the end sides of the upper surface of the channel protecting layer BLa along the predetermined direction. Further, the source electrode Tras and the drain electrode Trad are provided so as to face each other on the upper surface of the channel protecting layer BLa having a gap therebetween. That is, at the end sides of the channel protecting layer BLa, a portion of the source electrode Tras and a portion of the drain electrode Trad overlapped on the channel protecting layer BLa.

Similarly to the thin film transistor TrA, the source electrode Trbs and the drain electrode Trbd of the thin film transistor TrB are also arranged along the predetermined direction (x direction) so as to have a gap between each other and to face each other. The source electrode Trbs and the drain electrode Trbd are respectively provided at the end sides on the upper surface of the semiconductor layer SMC in the predetermined direction, and a portion of the source electrode Trbs and a portion of the drain electrode Trbd are respectively provided so as to extend on portions at the end sides of the upper surface of the channel protecting layer Blb along the predetermined direction. Further, the source electrode Trbs and the drain electrode Trbd are provided so as to face each other on the upper surface of the channel protecting layer Blb having a gap therebetween. That is, at both end sides of the channel protecting layer BLb, a portion of the source electrode Trbs and a portion of the drain electrode Trbd overlapped on the channel protecting layer BLb.

Between the source electrode Tras and the semiconductor layer SMC and between the drain electrode Trad and the semiconductor layer SMC, the impurity layers OHM formed of an ohmic contact layer are respectively provided, and the source electrode Tras and the semiconductor layer SMC and the drain electrode Trad and the semiconductor layer SMC are electrically connected. Similarly, between the source electrode Trbs and the semiconductor layer SMC and between the drain electrode Trbd and the semiconductor layer SMC, the impurity layers OHM formed of an ohmic contact layer are respectively provided, and the source electrode Trbs and the semiconductor layer SMC and the drain electrode Trbd and the semiconductor layer SMC are electrically connected.

Moreover, channel regions which become current paths when the thin film transistor TrA and the thin film transistor TrB are operating are formed at least in regions on lower surfaces of the channel protecting layers BLa and BLb in the semiconductor layers SMC. At this time, the regions where the source electrode Tras and the drain electrode Trad of the thin film transistor TrA overlapped on the channel protecting layer BLa (overlapping regions) overlap the channel region in the semiconductor layer SMC, and the regions where the source electrode Trbs and the drain electrode Trbd of the thin film transistor TrB overlapped on the channel protecting layer BLb (overlapping regions) overlap the channel region in the semiconductor layer SMC.

Furthermore, a protection insulation film 13 for protecting the thin film transistor TrA and the thin film transistor TrB from corrosion and damage due to external environment is provided on the substrate 11 including the thin film transistors TrA and TrB so as to cover the thin film transistor TrA, the thin film transistor TrB and the gate insulating film 12.

Here, the size (that is, a channel width of the thin film transistor TrA) Wca of the source electrode Tras and the drain electrode Trad of the thin film transistor TrA in the y direction and the size (that is, a channel width of the thin film transistor TrB) Wcb of the source electrode Trbs and the drain electrode Trbd of the thin film transistor TrB in the y direction are set so as to be equal (Wca=Wcb).

Further, the source electrode Tras and the drain electrode Trad of the thin film transistor TrA are formed in the same layer and the source electrode Trbs and the drain electrode Trbd of the thin film transistor TrB are formed in the same layer, and by patterning a single source/drain metal layer formed on the substrate 11, the source electrode Tras and the drain electrode Trad of the thin film transistor TrA and the source electrode Trbs and the drain electrode Trbd of the thin film transistor TrB are formed in the same process in a lump.

Furthermore, in the thin film transistor TrA, the semiconductor layer SMC is provided so as to conform with the plan figuration of the transistor forming region Rta formed of the channel protecting layer BLa, the source electrode Tras and the drain electrode Trad, for example. Further, in the thin film transistor TrB, the semiconductor layer SMC is provided so as to conform with the plan figuration of the transistor forming region Rtb formed of the channel protecting layer BLb, the source electrode Trbs and the drain electrode Trbd.

As shown in FIG. 1A, in the transistor TFT which is applied in the semiconductor device according to the configuration example, the source electrode Tras and the drain electrode Trad of the thin film transistor TrA are provided so as to be arranged at opposite positions with reference to the center line CL (the center line of cross-section in FIGS. 1B and 1C) with respect to the width direction (x direction) of the gate electrode Trg (or the channel protecting layer BLa) which is used for both of the thin film transistors TrA and TrB, and the source electrode Trbs and the drain electrode Trbd of the thin film transistor TrB are provided so as to be arranged at opposite positions with reference to the center line CL with respect to the width direction (x direction) of the gate electrode Trg (or the channel protecting layer BLb).

That is, as shown in FIG. 1A, in the thin film transistor TrA, the source electrode Tras is provided on the left side with respect to the center line CL (or the gate electrode Trg or the channel protecting layer BLa) in the drawing, and the drain electrode Trad is provided on the right side with respect to the center line CL (or the gate electrode Trg or the channel protecting layer BLa) in the drawing. On the other hand, in the thin film transistor TrB, the source electrode Trbs is provided on the right side with respect to the center line CL (or the gate electrode Trg or the channel protecting layer BLb) in the drawing, and the drain electrode Trbd is provided on the left side with respect to the center line CL (or the gate electrode Trg or the channel protecting layer BLb) in the drawing.

In addition, in the transistor TFT which is applied in the semiconductor device according to the configuration example, the source electrode Tras of the thin film transistor TrA and the source electrode Trbs of the thin film transistor TrB are connected to each other via the source connecting wiring LNs.

Here, as shown in FIGS. 1A and 1D, the source connecting wiring LNs is provided integrally with the source electrodes Tras and Trbs, and the source connecting wiring LNs includes the first connecting wiring LNs1 and LNs3 which are formed of a conductor layer formed in the same process as the source electrodes Tras and Trbs in the same layer with the source electrodes Tras and Trbs by patterning the single source/drain metal layer formed on the substrate 11 and the second connecting wiring LNs2 which is formed of a conductor layer provided in a layer different from the layer of the source electrodes Tras and Trbs and which is connected to the first connecting wiring via the contact holes CHsa and CHsb.

As shown in FIGS. 1C and 1D, the second connecting wiring LNs2 of the source connecting wiring LNs is in the same layer as the gate electrode Trg, is provided on the lower layer side with respect to the first connecting wiring and is formed in a lump in the same process of forming the gate electrode Trg by patterning a single gate metal layer formed on the substrate 11, for example.

Further, as shown in FIGS. 1A, 1B and 1C, the source connecting wiring LNs is provided outside of the transistor forming regions Rta and Rtb which are set on the substrate 11 at a position except a region overlapped with the gate electrode Trg and the gate connecting wiring LNg in a perpendicular direction (the IC direction shown in FIGS. 1B and 1C) with respect to the plan direction of the upper surface of the substrate 11, that is, with respect to a direction along the plan surface extending in the x direction and the y direction shown in FIG. 1A. Further, the source electrode Tras of the thin film transistor TrA and the source electrode Trbs of the thin film transistor TrB are connected to the source connecting wiring LNs at outside of the transistor forming regions Rta and Rtb.

The drain electrode Trad of the thing film transistor TrA and the drain electrode Trbd of the thin film transistor TrB are connected with each other via the drain connecting wiring LNd.

Here, the drain connecting wiring LNd is a third connecting wiring which is provided integrally with the drain electrodes Trad and Trbd, and which is formed of a conductor layer which is formed in the same process as the source electrode Tras, the drain electrode Trad, the source electrode Trbs and the drain electrode Trbd in the same layer by patterning the single source/drain metal layer formed on the substrate 11.

Further, as shown in FIGS. 1A, 1B and 1C, the drain connecting wiring LNd is also provided outside of the transistor forming regions Rta and Rtb which are set on the substrate 11 at a position except a region overlapped with the gate electrode Trg and the gate connecting wiring LNg in a perpendicular direction (the IC direction shown in FIGS. 1B and 1C) with respect to the plan direction of the upper surface of the substrate 11, that is, with respect to the direction along the plan surface extending in the x direction and the y direction shown in FIG. 1A. Further, the drain electrode Trad of the thin film transistor TrA and the drain electrode Trbd of the thin film transistor TrB are connected to the drain connecting wiring LNd at outside of the transistor forming regions Rta and Rtb.

The transistor TFT having the above described device structure can be expressed by the equivalent circuits as shown in FIGS. 2A and 2B, for example. That is, the transistor TFT according to the configuration example has a circuit structure in which the thin film transistor TrA and the thin film transistor TrB are connected in parallel and in which the gate electrode Trg is commonly connected to the thin film transistor TrA and the thin film transistor TrB. Therefore, the transistor TFT according to the configuration example has a drive capacity equivalent to that of a thin film transistor having the channel width Wca+Wcb in which the channel width Wca of the thin film transistor TrA and the channel width Wcb of the thin film transistor TrB are virtually added.

Here, in the above described configuration example, the case in which the first connecting wiring LNs1 in the source connecting wiring LNs for connecting the source electrode Tras of the thin film transistor TrA and the source electrode Trbs of the thin film transistor TrB is formed of a conductor layer which is provided in the same layer as the layer of the source electrode Tras and the source electrode Trbs and in which the drain connecting wiring LNd for connecting the drain electrode Trad of the thin film transistor TrA and the drain electrode Trbd of the thin film transistor TrB is formed of a conductor layer which is provided in the same layer as the layer of the drain electrode Trad and the drain electrode Trbd is described. However, the transistor to be applied in the semiconductor device of the present invention is not limited to having the device structure shown in the above described configuration example. That is, the first connecting wiring LNs1 in the source connecting wiring LNs for connecting the source electrode Tras of the thin film transistor TrA and the source electrode Trbs of the thin film transistor TrB may be formed of a conductor layer which is formed in a different layer from the layer of the source electrode Tras and the source electrode Trbs, and the drain connecting wiring LNd for connecting the drain electrode Trad of the thin film transistor TrA and the drain electrode Trbd of the thin film transistor TrB may be formed of a conductor layer which is formed in a different layer from the layer of the drain electrode Trad and the drain electrode Trbd.

Further, in the above described configuration example, the transistor TFT is formed of the thin film transistor TrA and the thin film TrB which are provided so as to be adjacent to each other in the y direction on the substrate 11. However, the transistor TFT of the configuration example is not limited to this.

It is sufficient that the thin film transistor TrA and the thin film transistor TrB constituting the transistor TFT have the above described connecting relation with each other and the source electrode and the drain electrode of each transistor are disposed along the same direction in both of the transistors. Therefore, for example, the source electrode and the drain electrode of each of the thin film transistor TrA and the thin film transistor TrB may be arranged along the x direction and the transistors may be adjacent to each other in the x direction as shown in FIG. 3. Similarly, the source electrode and the drain electrode of each of the thin film transistor TrA and the thin film transistor TrB may be arranged along the y direction and the transistors may be adjacent to each other in the y direction.

Moreover, in the above description, the thin film transistor TrA and the thin film transistor TrB are arranged in proximity to each other. However, the present invention is not limited to this. As long as the thin film transistor TrA and the thin film transistor TrB have the above described connecting relation with each other, the transistors may be arranged so as to be separated from each other to some extent.

That is to say, in the transistor applied in the semiconductor device of the present invention, the source electrodes of the thin film transistors TrA and TrB are electrically connected and the drain electrodes of the thin film transistors TrA and TrB are electrically connected. Further, it is sufficient that either one of the connecting wiring which connects the source electrodes or the connecting wiring which connects the drain electrodes is the connecting wiring, by which either of the electrodes are connected to each other, formed of a conductor layer which is formed in a layer different from the layer of the source/drain metal layer.

Therefore, at least one of the source connecting wiring LNs for connecting the source electrodes of the thin film transistors TrA and TrB or the drain connecting wiring LNd for connecting the drain electrodes of the thin film transistors TrA and TrB shown in the above described configuration example may be the connecting wiring, by which the electrodes are connected, formed of a conductor layer which is formed in a layer different from the layer of the source/drain metal layer, for example, a conductor layer provided on the lower layer or the upper layer of the source/drain metal layer. Further, at least one of the source connecting wiring LNs and the drain connecting wiring LNd may be a conductor layer of the lower layer or the upper layer of the source-drain metal layer. Here, the configuration example of such device structure will be described in detail in a description of application example to the light emitting device which will be described later.

(Verification of Operation and Effect)

Next, the operation and effect of the above described semiconductor device (transistor) will be described in detail by showing a comparison example.

Here, a commonly used thin film transistor having the channel-stopper type inverted-stagger structure is shown as a comparison example of the semiconductor device of the present invention to verify the effect of misalignment, and thereafter, superiority of the operation and effect of the semiconductor device (transistor) of the present invention will be described.

Figure 4A:
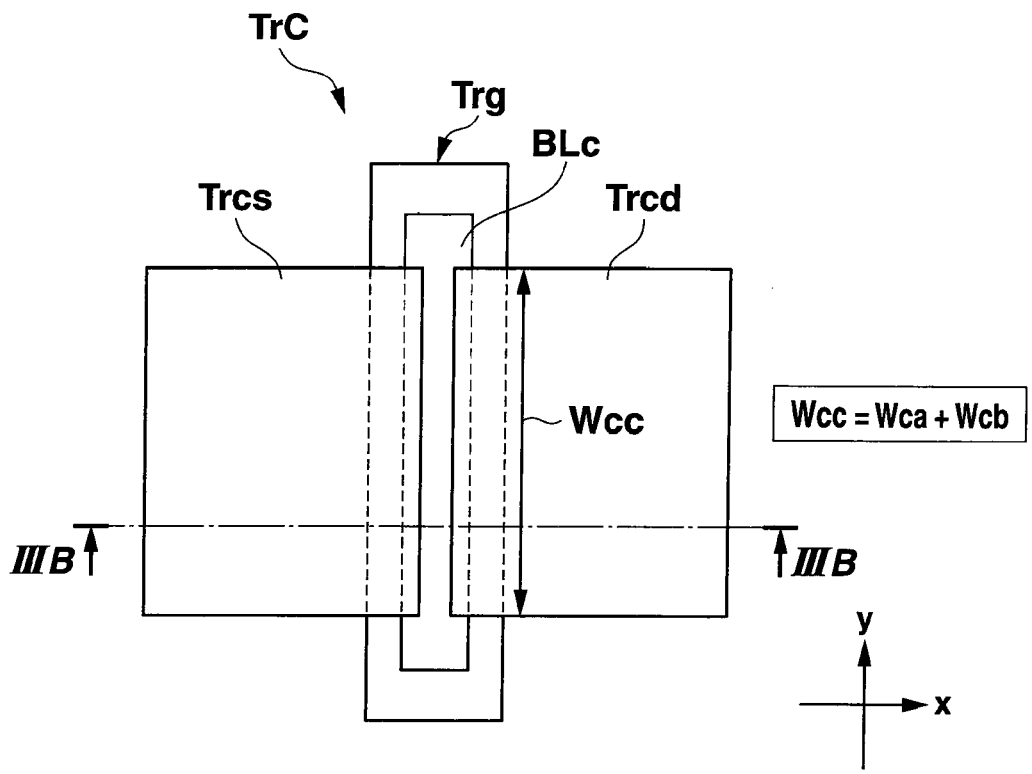
FIG. 4A is a schematic plan view of a semiconductor device of a comparison example with respect to the semiconductor device of the present invention.
Figure 4B:
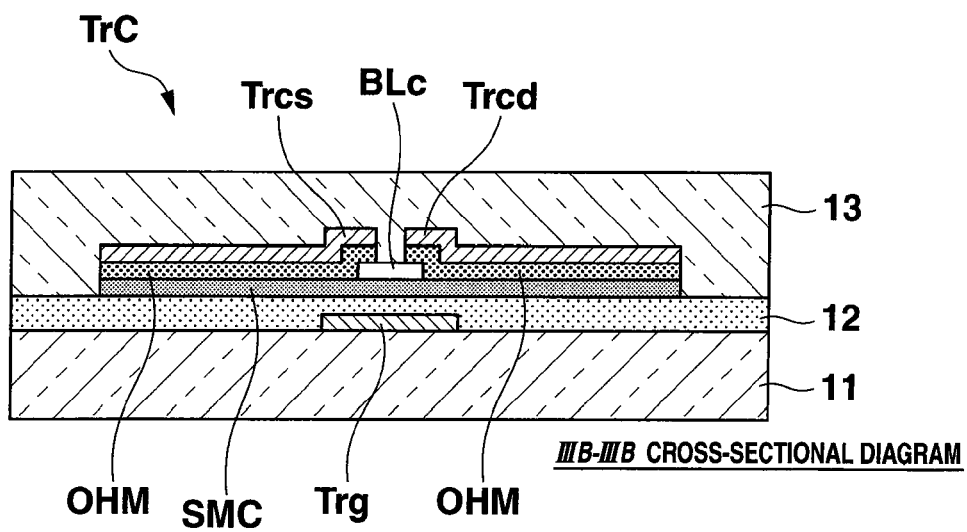
FIG. 4B is a schematic cross-sectional view of the semiconductor device of the comparison example with respect to the semiconductor device of the present invention.

FIGS. 4A and 4B are schematic configuration diagram showing the comparison example with respect to the semiconductor device of the present invention.

FIG. 4A is a schematic plan view of a semiconductor device (thin film transistor) according to the comparison example.

FIG. 4B shows a cross-section cut along the line IIIB-IIIB (in the specification, "III" is used for descriptive purpose as a symbol corresponding to the roman numeral "3" shown in FIG. 4A) in the semiconductor device (thin film transistor) having the plan layout shown in FIG. 4A.

Here, same symbols are used for structures similar to that of FIGS. 1A and 1B and the descriptions are simplified.

As shown in FIGS. 4A and 4B, the comparison example which is a conventional configuration with respect to the semiconductor device of the present invention has a structure in which a well known thin film transistor TrC having the channel-stopper type inverted-stagger structure is provided on the insulating substrate 11. In such thin film transistor TrC, the source electrode Trcs and the drain electrode Trcd are provided on the semiconductor layer SMC and a portion of the source electrode Trcs and a portion of the drain electrode Trcd respectively extend onto portions at the end sides of the upper surface of the channel protecting layer BLc which is provided on the semiconductor layer SMC in a direction (x direction) in which the source electrode Trcs and the drain electrode Trcd face each other, the source electrode Trcs and the drain electrode Trcd being provided via the impurity layer OHM. That is, in the thin film transistor TrC of the comparison example, the source electrode Trcs and the drain electrode Trcd are respectively provided so as to overlap (piled up in a plane) with the channel protecting layer BLc at the end sides of the channel protecting layer BLc. Further, a channel region which becomes the current path when the thin film transistor TrC is in operation is formed at least at the region on the lower surface side of the channel protecting layer BLc in the semiconductor layer SMC. At this time, the overlapping regions of the source electrode Trcs and the drain electrode Trcd overlap in a plane with the channel region formed in the semiconductor layer SMC.

Here, in order to compare the transistor of the comparison example to the transistor TFT of the present invention, the channel width Wcc of the thin film transistor TrC is set to the sum of the channel widths Wca and Wcb of the thin film transistors TrA and TrB (Wcc=Wca+Wcb). That is, the transistor TFT constituted with the thin film transistors TrA and TrB has the same drive capacity as that of the thin film transistor TrC.

FIGS. 5A to 5D are diagrams for explaining the misalignment in the thin film transistor of the comparison example and the effect thereof.

FIGS. 5A to 5C are schematic plan views for explaining the changes in the overlap (piled up in a plane) condition of the channel protecting layer BLc and the source electrode Trcs and the drain electrode Trcd due to the misalignment in the thin film transistor of the comparison example. Here, in FIGS. 5A to 5C, the regions where the channel protecting layer BLc, the source electrode Trcs and the drain electrode Trcd overlap are indicated by bold lines for descriptive purpose.

FIG. 5D is a diagram showing the change in device characteristic (Vg-Ids characteristic) of the thin film transistor TrC with respect to the change in overlap condition of the channel protecting layer BLc, the source electrode Trcs and the drain electrode Trcs due to the misalignment.

When forming the source electrode Trcs and the drain electrode Trcd in the well known thin film transistor TrC shown in FIGS. 4A and 4B, a photolithography method using a photomask is applied in general. Here, positioning of the photomask may be slightly misaligned with respect to the designed pattern, processing sizes of various types of films formed on the substrate 11 may be slightly different depending on the place on the substrate and the substrate 11 may be slightly warped or modified due to physical and chemical processes and the like in the manufacturing procedure. As a result, as shown in FIGS. 5A to 5C, there is a possibility that a misalignment in which the source electrode Trcs and the drain electrode Trcd are formed by being misaligned in the up-down direction or in the right-left direction or in both directions with respect to the gate electrode Trg or the channel protecting layer BLc occurs.

Here, to simplify the description, a case in which a misalignment of the source electrode Trcs and the drain electrode Trcd occurs in the right-left direction in the drawing (x direction shown in FIG. 4A) with respect to the channel protecting layer BLc will be described in FIGS. 5A to 5C. FIG. 5A shows a case in which the source electrode Trcs and the drain electrode Trcd are shifted in the left direction in the drawing with respect to the channel protecting layer BLc due to the misalignment and FIG. 5C shows a case in which the source electrode Trcs and the drain electrode Trcd are shifted in the right direction in the drawing with respect to the channel protecting layer BLc due to the misalignment. Further, FIG. 5B shows a case in which misalignment of the source electrode Trcs and the drain electrode Trcd does not occur.

When such misalignment of the source electrode Trcs and the drain electrode Trcd occur, the device characteristic (Vg-Ids characteristic) of the thin film transistor changes as shown in FIG. 5D.

Here, as an example, a relation between the gate voltage Vg and the drain-source current which flows in the direction of the source electrode Trcs from the drain electrode Trcd when the channel ratio W/L=10 and the drain-source voltage Ids=10V in the n-channel type amorphous silicon thin film transistor (n-ch TFT) is shown. Further, in FIG. 5D, the drain-source current Ids which is the vertical axis is shown in a log-scale in order to clearly show the behavior of the device characteristic.

As for the behavior of the device characteristic (Vg-Id characteristic) of the thin film transistor TrC in which the misalignment is not occurred as shown in FIG. 5B, the drain-source current Ids shows the current value of about $1.0 \times 10^{-6}$ A, for example, in the ON region which is on the plus voltage side wherein the gate voltage Vg=0V being the border as shown in the characteristic line SPb in FIG. 5D. Further, the drain-source current Ids shows the current value of about $1.0\times10^{-12}$ A, for example, in the OFF region which is on the minus voltage side.

On the other hand, when the source electrode Trcs and the drain electrode Trcd are shifted in the left direction in the drawing with respect to the channel protecting layer BLc due to the misalignment as shown in FIG. 5A, that is, when the misalignment occurs in a direction in which the overlap size on the source electrode Trcs side becomes small and the overlap size on the drain electrode Trcd side becomes large, the device characteristic of the thin film transistor TrC shows that the current value of the drain-source current (ON current) Ids tends to be greater comparing to the characteristic line SPb in the ON region in which the gate voltage Vg falls on the positive voltage side as shown in the characteristic line Spa in FIG. 5D.

On the other hand, when the source electrode Trcs and the drain electrode Trcd are shifted in the right direction in the drawing with respect to the channel protecting layer BLc due to the misalignment as shown in FIG. 5C, that is, when the misalignment occurs in a direction in which the overlap size on the source electrode Trcs side becomes large and the overlap size on the drain electrode Trcd side becomes small, the device characteristic of the thin film transistor TrC shows that the current value of the drain-source current (ON current) Ids tends to be smaller comparing to the characteristic line SPb in the On region.

In such way, by the source electrode Trcs and the drain electrode Trcd shifting in left or right direction in the drawing with respect to the channel protecting layer BLc, the drain-source current (ON current) Ids increases or decreases.

When the above thin film transistor TrC is applied as the drive transistor of the organic EL device which is the current driven light emitting device, for example, the light emitting luminance of the organic EL device of each pixel be roughly proportional to the current value of the drain-source current Ids that flows into the drive transistor of the pixel in a display panel in which a plurality of pixels each of which including the organic EL device and the drive transistor are arranged in the display region. Therefore, in order to obtain a uniform light emitting in the surface of the display region in the display panel, there is a need to suppress variation in the current values of the drain-source current Ids with respect to a predetermined gate voltage Vg in the drive transistors (thin film transistors) of the pixels.

Here, a relation between the values of misalignment of the source electrode Trcs and the drain electrode Trcd with respect to the channel protecting layer BLc and variation in the current values of the drain-source current (ON current) Ids will be verified.

FIGS. 6A to 6D are diagrams showing a relation between the amount of misalignment of the source electrode and the drain electrode with respect to the channel protecting layer BLc in the thin film transistor and variation in the current values of the drain-source current.

Here, FIGS. 6A, 6B and 6C are diagrams for explaining the relation between the misalignment condition and the amount of misalignment, and a direction in which the source electrode Trcs and the drain electrode Trcd face each other is set to x direction and the longitudinal direction of the channel protecting layer BLc orthogonal to the x direction is set to y direction. Further, a direction toward the drain electrode Trcd from the source electrode Trcs is set to the plus direction of the x direction and a direction toward the source electrode Trcs from the drain electrode Trcd is set to the minus direction of the x direction.

FIG. 6A shows a case in which the source electrode Trcs and the drain electrode Trcd are shifted in the minus x direction with respect to the channel protecting layer BLc, and FIG. 6C shows a case in which the source electrode Trcs and the drain electrode Trcd are shifted in the plus x direction with respect to the channel protecting layer BLc. Further, FIG. 6B shows a case in which the misalignment does not occur.

The line drawn at the center between the source electrode Trcs and the drain electrode Trcd which face each other when the misalignment of the source electrode Trcs and the drain electrode Trcd does not occur as shown in FIG. 6B is set to the reference line SL. Further, the distance between the center line SDC which is drawn at the center between the source electrode Trcs and the drain electrode Trcd when misalignment occurs as shown in FIGS. 6A and 6C and the reference line SL in the x direction is set to the amount of misalignment. As for the misalignment shown in FIG. 6A, the amount of misalignment is a minus value and as for the misalignment shown in FIG. 6C, the amount of misalignment is a plus value.

Figure 6D:
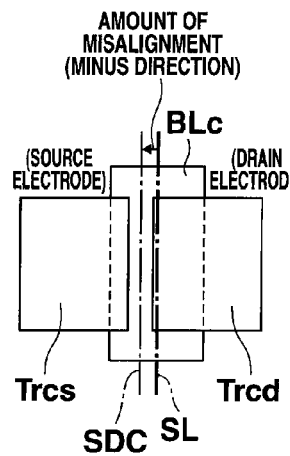
FIG. 6D is a diagram showing a relation between amounts of misalignment of the source electrode and the drain electrode, current values of drain-source currents and variation thereof.
Figure 6D:
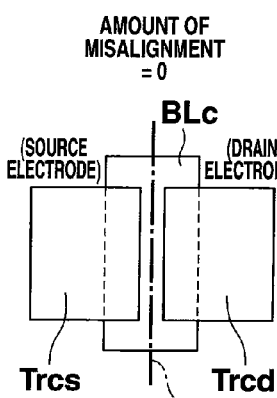
Figure 6D:
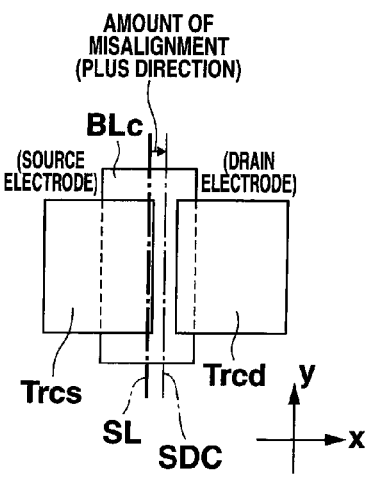
Figure 6D:
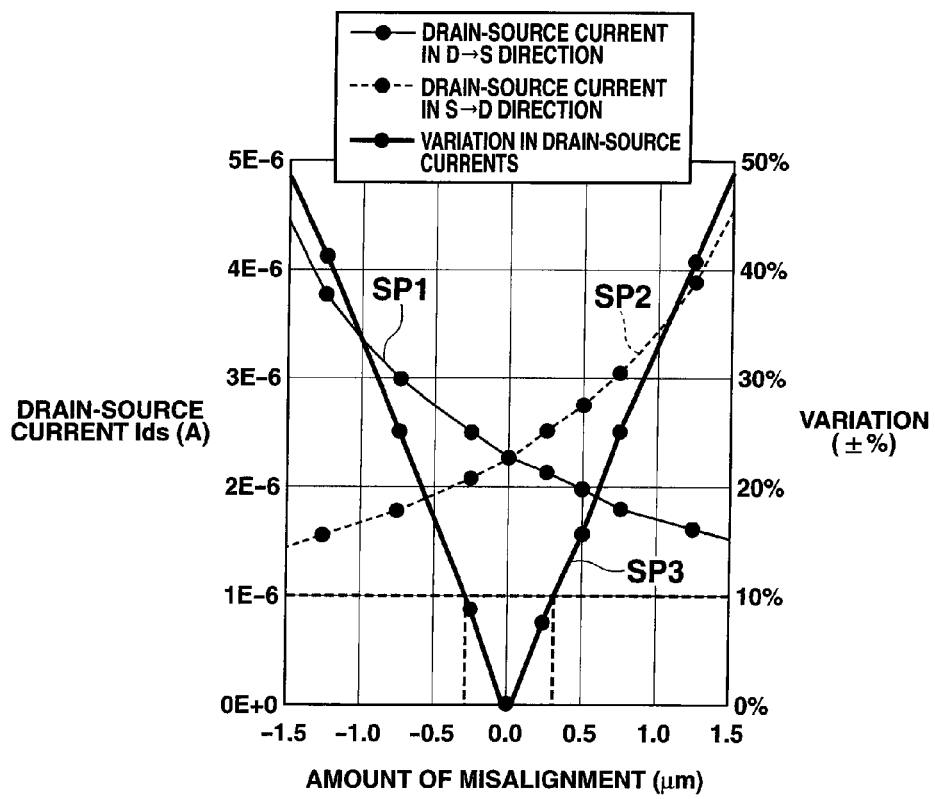

Next, FIG. 6D is a diagram showing a relation between the amount of misalignment of the source electrode and the drain electrode in the thin film transistor and the current values of the drain-source current and variation thereof.

Here, the drain-source current is a current that flows between the source electrode and the drain electrode when the thickness of the gate insulating film is 400 nm, the thickness of the channel protecting film BLc is 240 nm, the channel width W corresponding to the widths of the source electrode Trcs and the drain electrode Trcd in the y direction is 350 μm and the channel length corresponding to the width of the channel protecting film BLc in the x-direction is 7.4 μm in the n-channel type amorphous silicon thin film transistor (n-ch TFT) and when the gate voltage Vg is set to 5V and the drain voltage Vd is set to 10V.

In FIG. 6D, the line SP1 shows the variation characteristic of the drain-source current Ids that flows in a direction of drain (D)→source(S) with respect to the amount of misalignment.

The line SP2 shown the variation characteristic of the drain-source current Ids that flows in a direction of source (S)→drain (D).

The line SP3 shows the ratio of the difference between the current values of the drain-source currents Ids in the line SP1 and the line SP2 with respect to the amount of misalignment to the current value of the drain-source current Ids when the misalignment does not occur, and shows the level of variation in the current values of the drain-source current Ids which flows in the thin film transistors which occurs due to the misalignment, the thin film transistors being provided as the drive transistors of a plurality of pixels arranged in the surface of the display region in the display panel. That is, the misalignment is a relative displacement between the source electrode Trcs and the drain electrode Trcd and the channel protecting layer BLc, therefore, when there is a predetermined amount of misalignment, the thin film transistors in which the source electrodes Trcs and the drain electrodes Trcd are misaligned for a predetermined amount in the plus x direction with respect to the channel protecting layer BLc and the thin film transistors in which the source electrodes Trcs and the drain electrodes Trcd are misaligned for the same predetermined amount in the minus x direction may be mixed in the plurality of thin film transistors as drive transistors. The SP3 shows the ratio of the difference between the current values of the drain-source current Ids that flows in the thin film transistors that occurs in the above case with respect to when there is no misalignment.

As shown in the lines SP1 and SP2 in FIG. 6D, the drain-source currents Ids have equal current values when there is no misalignment (amount of misalignment=0.0). Further, as the amount of misalignment increases in the plus direction and in the minus direction, the difference between the drain-source current Ids that flows in the direction of drain (D)→source (S) and the drain-source current Ids that flows in the direction of source (S)→drain (D) becomes large, and the variation in the drain-source currents Ids that flow in each of the thin film transistor in the surface becomes wide.

In order to obtain a uniform light emitting in the surface of the display region by having the plurality of pixels each of which including the thin film transistor which has the above characteristic as the drive transistor arranged in the display region of the display panel as described above, it is necessary to make the variation in the drain currents (ON current) Id with respect to a predetermined gate voltage Vg in the thin film transistors be about ±10% or smaller. Therefore, there is a need to control so that the misalignment of the source electrode and the drain electrode be about ±2.0 µm or smaller as shown in FIG. 6D.

However, in a substrate to be used for a display panel of large area, it is very difficult to control so that the amount of misalignment of the source electrodes and the drain electrodes be ±0.2 µm or smaller in the entire area of the substrate by using the current manufacturing technique. Therefore, the variation in the ON current characteristic of the thing film transistors becomes greater than ±10%, and consequently, the product yield is reduced and the display image quality is degraded.

Next, the current value of the drain-source current Ids with respect to the amount of misalignment of the source electrodes Tras, Trbs and the drain electrodes Trad, Trbd in the same condition as above will be verified for the transistor TFT according to the configuration example of the present invention.

FIGS. 7A and 7B to FIGS. 9A to 9B are diagrams showing relations between the amount of misalignment of the source electrodes and the drain electrodes and the current value of the drain current in the transistor TFT according to the configuration example of the present invention.

Here, in FIGS. 7A and 7B to FIGS. 9A and 9B, changes in the drain-source current Ids that flows in the direction of drain (D)→source (S) and the drain-source current Ids that flows in the direction of source (S)→drain (D) with respect to the amount of misalignment of the source electrodes Tras, Trbs and the drain electrodes Trad, Trbd are shown by the lines SP1 and SP2 in a similar manner as in FIG. 6D.

As shown in FIGS. 1A, 1B, 2A and 2B, the transistor TFT according to the configuration example of the present invention has the structure in which the thin film transistor TrA and the thin film transistor TrB are connected in parallel and in which the gate electrode Trg is used for both of the thin film transistor TrA and the thin film transistor TrB.

In addition, as shown in FIGS. 1A and 1B, the transistor TFT according to the above described configuration example has the circuit structure in which the source electrode Tras and the drain electrode Trad of the thin film transistor TrA and the source electrode Trbs and the drain electrode Trbd of the thin film transistor TrB are disposed so as to be at opposite positions with each other, respectively, in the x direction wherein the center line CL being the reference.

Figure 7A:
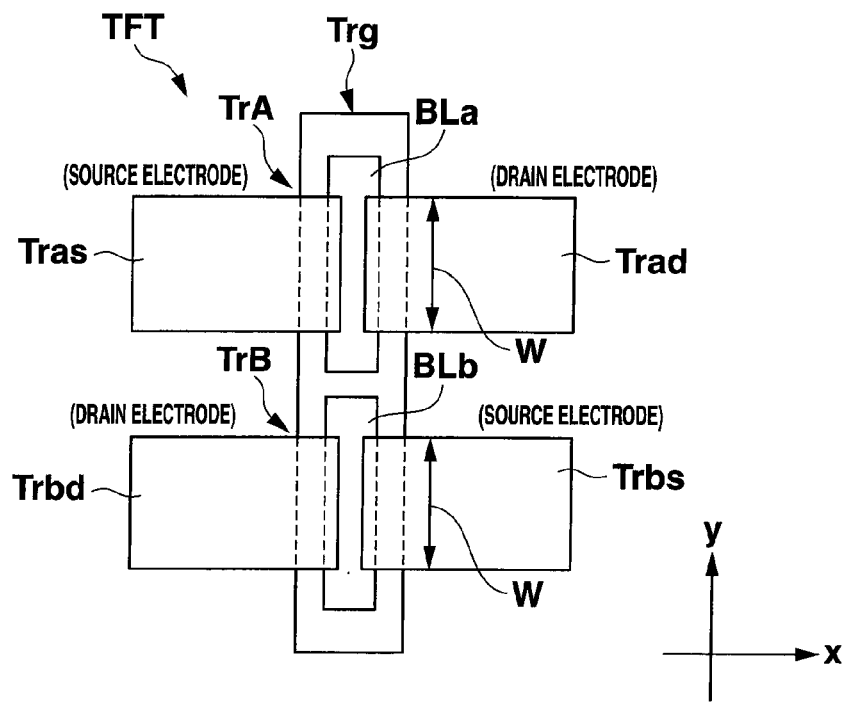
FIG. 7A is a schematic plan view (No. 1) of the transistor according to the configuration example of the present invention.
Figure 7B:
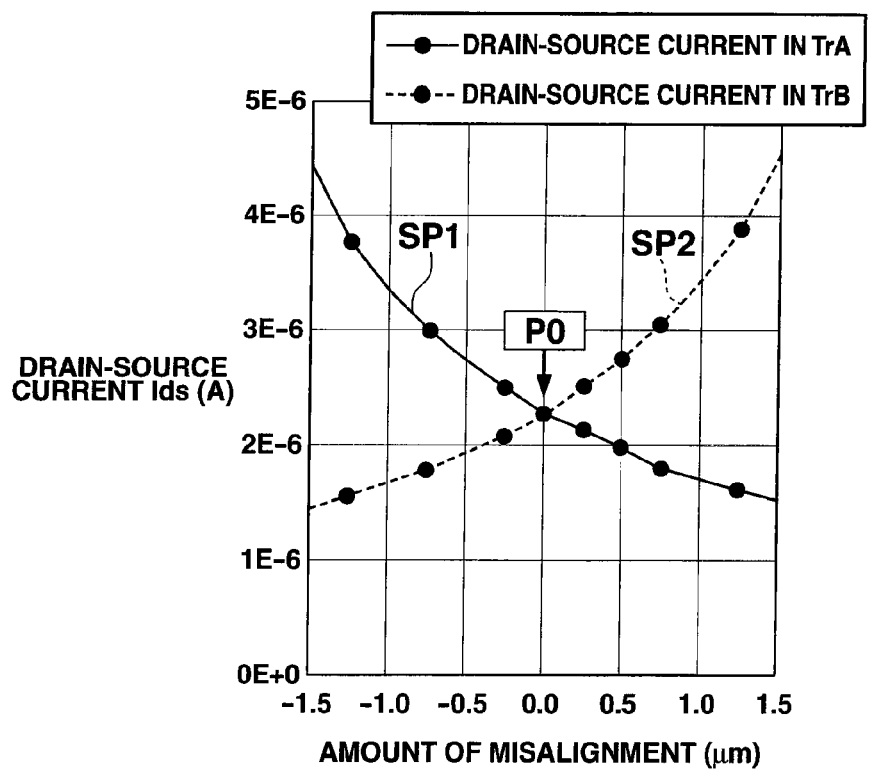
FIG. 7B is a diagram (No. 1) showing a relation between amounts of misalignment of the source electrode and the drain electrode and current values of drain-source currents in the transistor according to the configuration example of the present invention.
Figure 8A:
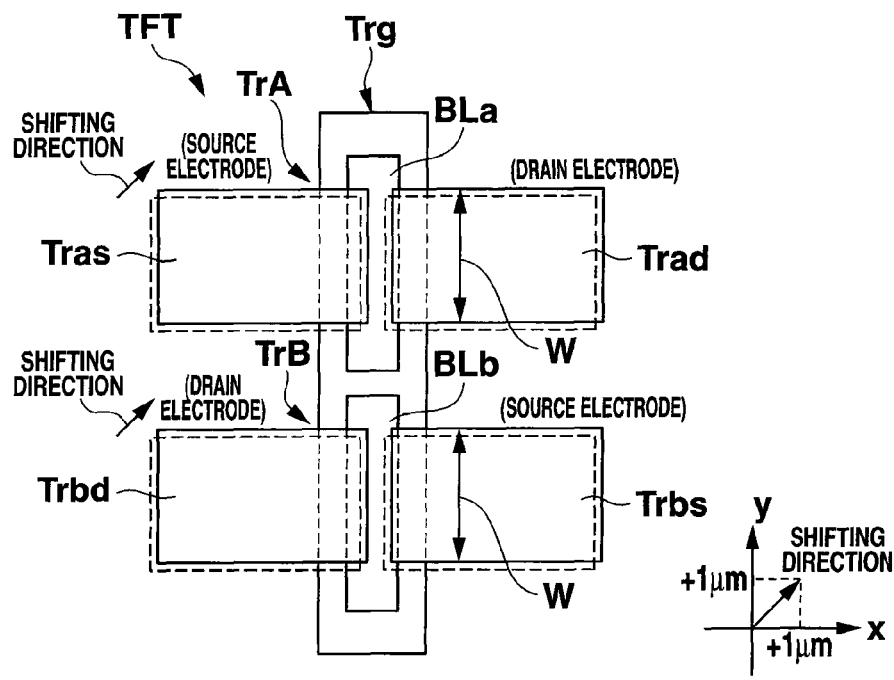
FIG. 8A is a schematic plan view (No. 2) of the transistor according to the configuration example of the present invention.
Figure 8B:
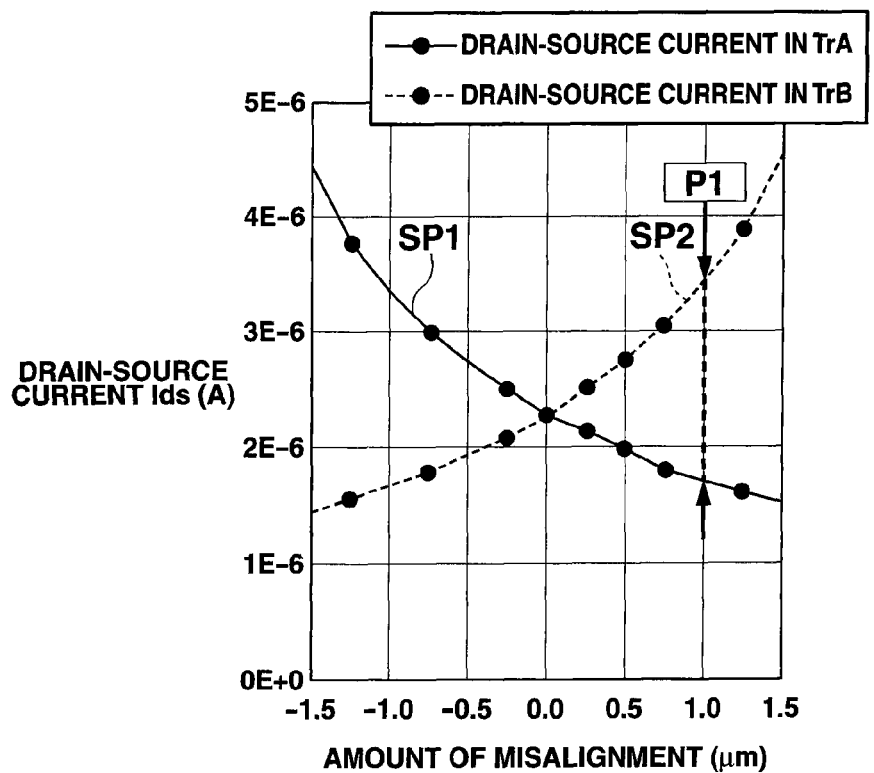
FIG. 8B is a diagram showing a relation between amounts of misalignment of the source electrode and the drain electrode and current values of drain-source currents in the transistor according to the configuration example of the present invention.
Figure 9A:
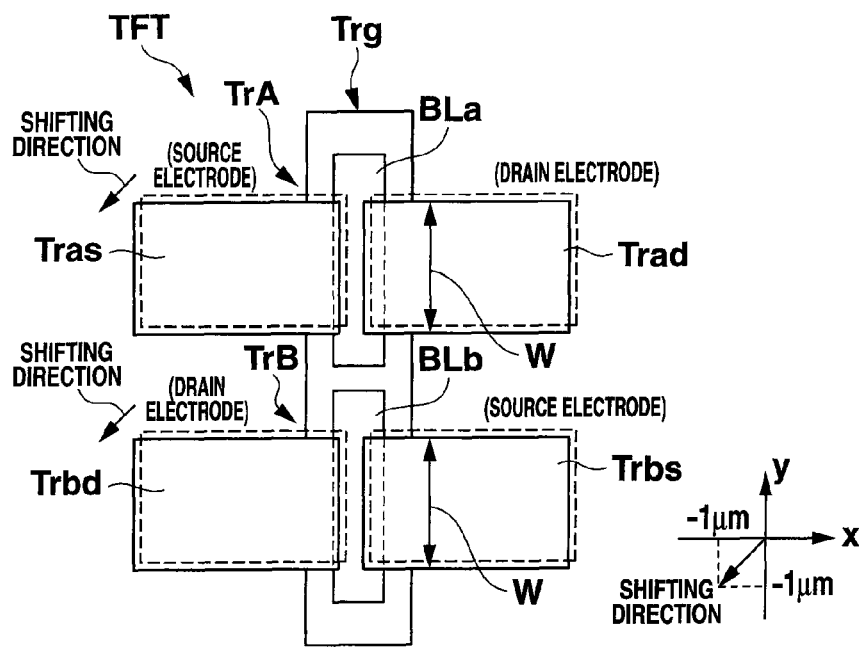
FIG. 9A is a schematic plan view (No. 3) of the transistor according to the configuration example of the present invention.
Figure 9B:
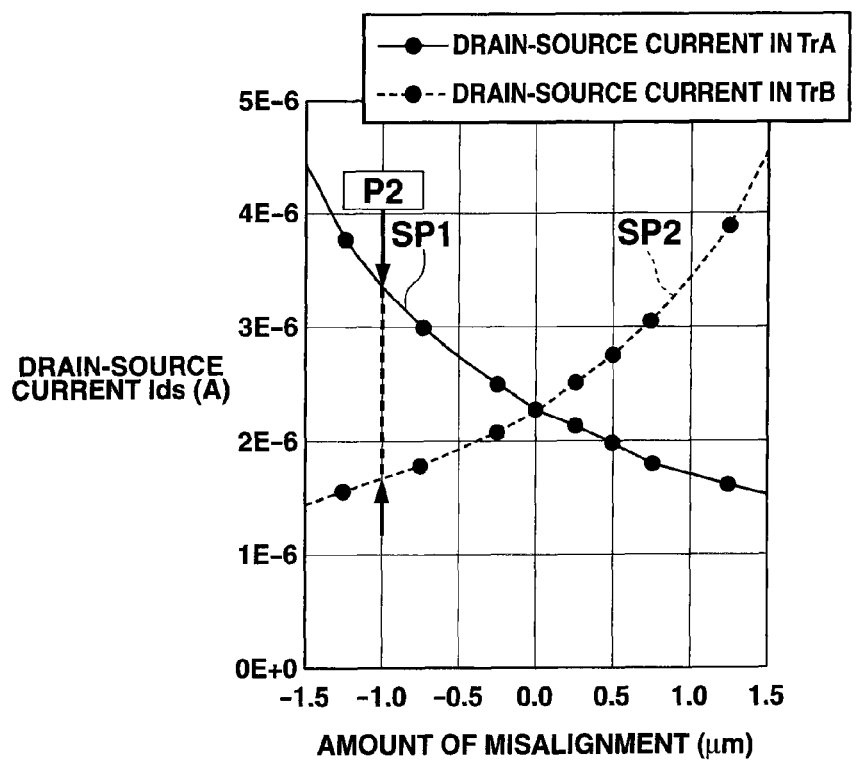
FIG. 9B is a diagram (No. 3) showing a relation between amounts of misalignment of the source electrode and the drain electrode and current values of drain-source currents in the transistor according to the configuration example of the present invention.

By having the above circuit structure, the variation characteristic of the drain-source current Ids that flows in the direction to the source electrode Tras from the drain electrode Trad with respect to the amount of misalignment in the thin film transistor TrA of the transistor TFT according to the configuration example of the present invention is as shown in the line SP1 shown in FIGS. 7B, 8B and 9B. Further, the variation characteristic of the drain-source current Ids that flows in the direction to the source electrode Trbs from the drain electrode Trbd with respect to the amount of misalignment is as shown in the line SP2 shown in FIGS. 7B, 8B and 9B.

When there is no misalignment (amount of misalignment=0.0) in the transistor TFT according to the configuration example of the present invention as shown in FIG. 7A, the drain currents Id in the lines SP1 and SP2 show equal current values and the current of about 4.6 (=2.3+2.3) µA which is the sum of the drain currents Id thereof flows as the ON current of the transistor TFT.

On the other hand, when the alignment occurs in the plus direction of x axis and y axis as shown in FIG. 8A and when the amount of misalignment is +1.0 µm, the drain current Id becomes small in the line SP1 and becomes large in the line SP2 as shown by the arrow P1 in FIG. 8B. Further, as the ON current of the transistor TFT, the current of about 5.1 (=1.7+3.4) µA which is the sum of the drain currents Id thereof flows.

Moreover, when the misalignment occurs in the minus direction of x axis and y axis as shown in FIG. 9A and when the amount of misalignment is −1.0 µm, the drain current Id becomes large in the line SP1 and becomes small in the line SP2 as shown by the arrow P2 in FIG. 9B. Further, as the ON current Id of the transistor TFT, the current of about 5.1 (=3.4+1.7) µA which is the sum of the drain currents Id thereof flows.

The comparison results of the drain current with respect to the amount of misalignment of the source electrode and the drain electrode between the transistor TFT according to the configuration example of the present invention and the thin film transistor according to the comparison example are shown in FIGS. 10A and 10B.

Here, FIG. 10A is the comparison result of actual measured values of the drain current Id with respect to the amounts of misalignment of the source electrode and the drain electrode. FIG. 10B is the comparison result of the drain currents in which the actual measured values shown in FIG. 10A are standardized by setting the case when there is no misalignment (amount of misalignment=0 µm) as the reference.

Here, in FIG. 10A, the current values of the drain current Id when the channel width (the channel width which is the sum of the thin film transistors TrA and TrB in the transistor TFT) W=700 µm, the channel length L=7.4 µm, the gate voltage Vg=5V and the drain voltage Vd=10V in the transistor TFT and the thin film transistor TrC are shown.

As shown in FIGS. 10A and 10B, the drain current (ON current) Id varies for about 50% at a maximum when the source electrode and the drain electrode are misaligned for about ±1 µm in the thin film transistor TrC according to the comparison example. In contrary, the variation in the drain currents (ON current) Id is suppressed to about 10% at a maximum in the present invention.

Therefore, when the thin film transistor of the present invention is applied as the drive transistor of each pixel in the display panel of large area as described above, the variation in the ON currents of the thin film transistors caused by the source electrode and the drain electrode being misaligned can be suppressed comparing to the conventional configuration, and further, a display apparatus which has a good display image quality and in which the product yield can be improved can be realized.

Here, in the transistor TFT according to the configuration example of the present invention, the device structure in which the transistor forming regions Rta and Rtb are provided on the substrate 11 so as to be near to each other and the source electrodes of the thin film transistors TrA and TrB and the drain electrodes of the thin film transistors TrA and TrB are respectively connected to each other by the connecting wiring which are provided outside of the transistor forming regions Rta and Rtb as shown in FIGS. 1A and 1B is shown.

Here, as for the layout design, the transistor forming regions Rta and Rtb may be set so as to be separated from each other and the connecting wirings may be provided therebetween so that the source electrodes and the drain electrodes can be directly connected. However, such device structure has the following problems.

First, in order to make the transistor forming regions Rta and Rtb be separated from each other, the area of the forming region of the entire transistor TFT including the thin film transistors TrA and TrB becomes large. Especially, when actually applying the above transistor to the pixels of the display apparatus and the like, problems such as the opening ratio of each pixel is to be reduced, the degree of freedom for designing the outline is to be suppressed and the like occur due to the forming area of the transistor being large. Here, the configuration example in which the transistor TFT according to the configuration example of the present invention is applied to the pixels of the display apparatus will be described later in detail.

Secondly, the gate electrode of the thin film transistors TrA and TrB which are disposed so as to be adjacent to each other is formed of a single conductor layer and the conductor layer which forms the gate electrode Trg extends over the space between the transistor forming regions Rta and Rtb. Here, when the connecting wiring is provided in the space between the transistor forming regions Rta and Rtb, the conductor layer which forms the connecting wiring and the gate electrode Trg is to be disposed so as to overlap in the direction perpendicular to the plan direction of the upper surface of the substrate 11, and the parasitic capacity between the connecting wiring and the gate electrode Trg increases. This increase in the parasitic capacity influences the operation of the thin film transistors TrA and TrB and a negative effect of influencing the display operation occurs.

Thirdly, especially in a thin film transistor having the inverted-stagger structure, the device structure is to be such that the distance between the semiconductor layer and other wiring layers is relatively short because the semiconductor layer is provided at the upper side of the layer in which the gate electrode is formed. Here, when the connecting wiring is provided in the space between the transistor forming regions Rta and Rtb, there is a possibility that the connecting wiring is to be provided relatively close to the channel forming region of the thin film transistor TrA or Trb. In such case, the connecting wiring is apt to function as a pseudo-gate electrode (top-gate effect) influencing the channel forming, and a negative effect of influencing the display operation occurs.

With respect to the above problems, in the configuration example of the present invention, the source electrodes of the thin film transistors TrA and TrB and the drain electrodes of the thin film transistors TrA and TrB are to be connected at positions outside of the transistor forming regions Rta and Rtb where do not overlap with the gate electrode Trg and the gate connecting wiring LNg in the perpendicular direction. In such way, the thin film transistors TrA and TrB can be disposed extremely close to each other, and the forming region of the transistor TFT can be suppressed from being large and the increase in the parasitic capacity and the influence of the top-gate effect due to the connecting wiring can be suppressed.

<Application Example to Light Emitting Device>

Next, an light emitting apparatus (display apparatus) and pixels in which the semiconductor devices (transistor) shown in the above described configuration example are applied will be described. Here, in the following application example, a case in which the transistors of the present invention are applied in the display apparatus including an organic EL display panel in which a plurality of pixels, each of which having an organic EL device, are two dimensionally arranged will be described.

First Embodiment

Figure 11A:
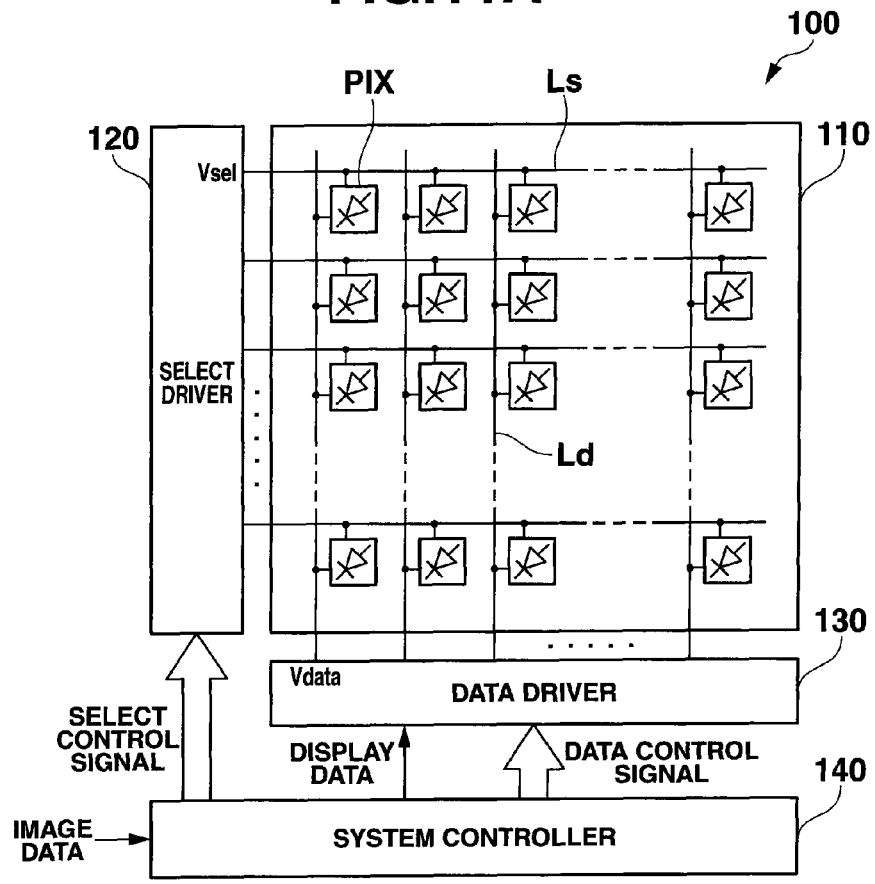
FIG. 11A is a schematic block diagram showing the first embodiment of a display apparatus in which the semiconductor devices of the present invention are applied.
Figure 11B:
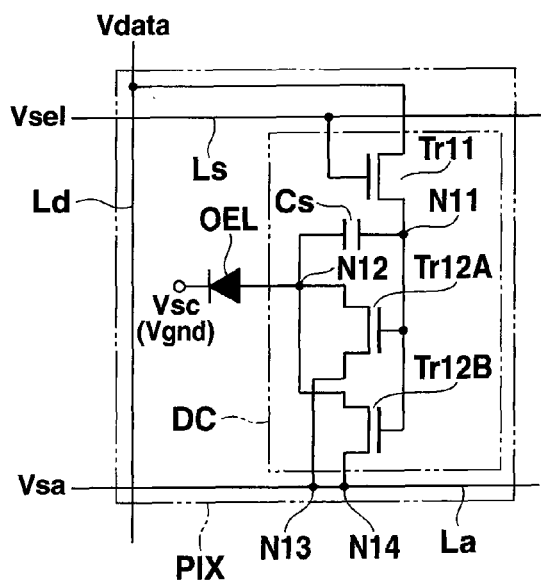
FIG. 11B is a diagram of an equivalent circuit showing the first embodiment of the display apparatus in which the semiconductor devices of the present invention are applied.

FIGS. 11A and 11B are schematic configuration diagrams showing the first embodiment of the display apparatus in which the semiconductor devices of the present invention are applied.

FIG. 11A is a schematic block diagram showing the display apparatus of the embodiment and FIG. 11B is a diagram of an equivalent circuit of a pixel which is applied in the display apparatus of the embodiment.

As shown in FIG. 11A, the display apparatus (light emitting apparatus) 100 of the first embodiment roughly includes a display panel (light emitting panel) 110 in which a plurality of pixels PIX are two dimensionally arranged, a select driver (select drive circuit) 120 for setting each pixel PIX to be in a select state, a data driver (signal drive circuit) 130 for supplying each pixel PIX with a tone signal according to image data and a controller 140.

Further, as shown in FIG. 11B, each of the pixels PIX which are arranged in the display panel 110 of the embodiment includes a light emitting drive circuit DC, an organic EL device OEL which is a current driven light emitting device.

As shown in FIG. 11B, the light emitting drive circuit DC includes a transistor Tr11, transistors Tr12A and Tr12B and a capacitor Cs, for example.

In the transistor (select transistor) Tr11, the gate terminal is connected to the select line Ls, the drain terminal is connected to the data line Ld and the source terminal is connected to the contact point N11.

In each of the transistors (drive transistor) Tr12A and Tr12B, the gate terminal is connected to the contact point N11, the drain terminal is connected to the power line La to which a high potential power voltage Vsa is applied via the contact points N13 and N14 and the source terminal is connected to the contact point N12.

The capacitor Cs is connected between the contact point N11 and N12.

Further, in the organic EL element (display element) OEL, an anode (a plus electrode; a pixel electrode which becomes an anode electrode) is connected to the contact point N12 of the light emitting drive circuit DC, and a cathode (a minus electrode; a counter electrode which becomes a cathode electrode) is connected to a predetermined low potential power source (reference voltage Vsc; for example, grounding potential Vgnd).

Here, the n-channel type thin film transistor is applied to all of the transistors Tr11, Tr12A and Tr12B. Further, the thin film transistors TrA and TrB having the device structure as shown in the above described configuration example are respectively applied to the transistors Tr12A and Tr12B.

The select line Ls which is connected to the pixel PIX is disposed in a row direction (the right-left direction in FIG. 11A) of the display panel 110 and is connected to the select driver 120. Further, the data line Ld is disposed in a line direction (the up-down direction in FIG. 11A) of the display panel 110 and is connected to the data driver 130.

The controller 140 generates display data formed of digital data including luminance tone data and supplies the display data to the data driver 130 based on image data supplied from outside of the display apparatus 100.

Further, based on a timing signal which is generated or extracted based on the image data, the controller 140 controls the operation state of the select driver 120 and the data driver 130 to generate and output a select control signal and a data control signal for executing a predetermined image display operation in the display panel 110.

As for the display drive operation of the display apparatus which includes the pixels PIX having the above described circuit structure, first, the tone voltage Vdata of a voltage value according to the image data is applied to the data line Ld while the transistor Tr11 is in the ON operation state (select state) by the select voltage Vsel of the select level (high level) being applied to the select line Ls in a predetermined selecting period. In such way, a potential according to the tone voltage Vdata is applied to the contact point N11 via the transistor Tr11. Further, in such way, a light emitting drive current according to the tone voltage Vdata flows between the drain electrodes and the source electrodes of the transistors Tr12A and Tr12B and the organic EL device OEL emits light. At this time, electric charge based on the tone voltage Vdata is accumulated (charged) in the capacitor Cs.

Next, in the non-selecting period, the transistor Tr11 is made to be in the OFF operation state (non-select state) by applying the select voltage Vsel of the non-select level (low level) to the select line Ls. At this time, by the electric charge which is accumulated in the capacitor Cs being maintained and a voltage corresponding to the tone voltage Vdata being applied to the contact point N11, the light emitting drive voltage of the current value equal to that of the light emitting operation state (selecting period) flows between the drain electrodes and the source electrodes of the transistors Tr12a and Tr12B and the organic EL device maintains the light emitting state. Further, by sequentially executing the above display drive operation for all of the pixels PIX in the display panel 110 in a row per unit, the desired image information is to be displayed.

Next, the particular device structure (pane layout and cross-sectional structure) of the pixel (light emitting drive circuit and organic EL device) having the above described circuit structure will be described.

Here, an organic EL display panel having a bottom emission type light emitting structure in which light which is emitted in the organic EL layer of the organic EL device OEL provided on one surface side of the substrate is irradiated to a viewing side (the other surface side of the substrate) by transmitting the transparent substrate is shown.

Figure 12:
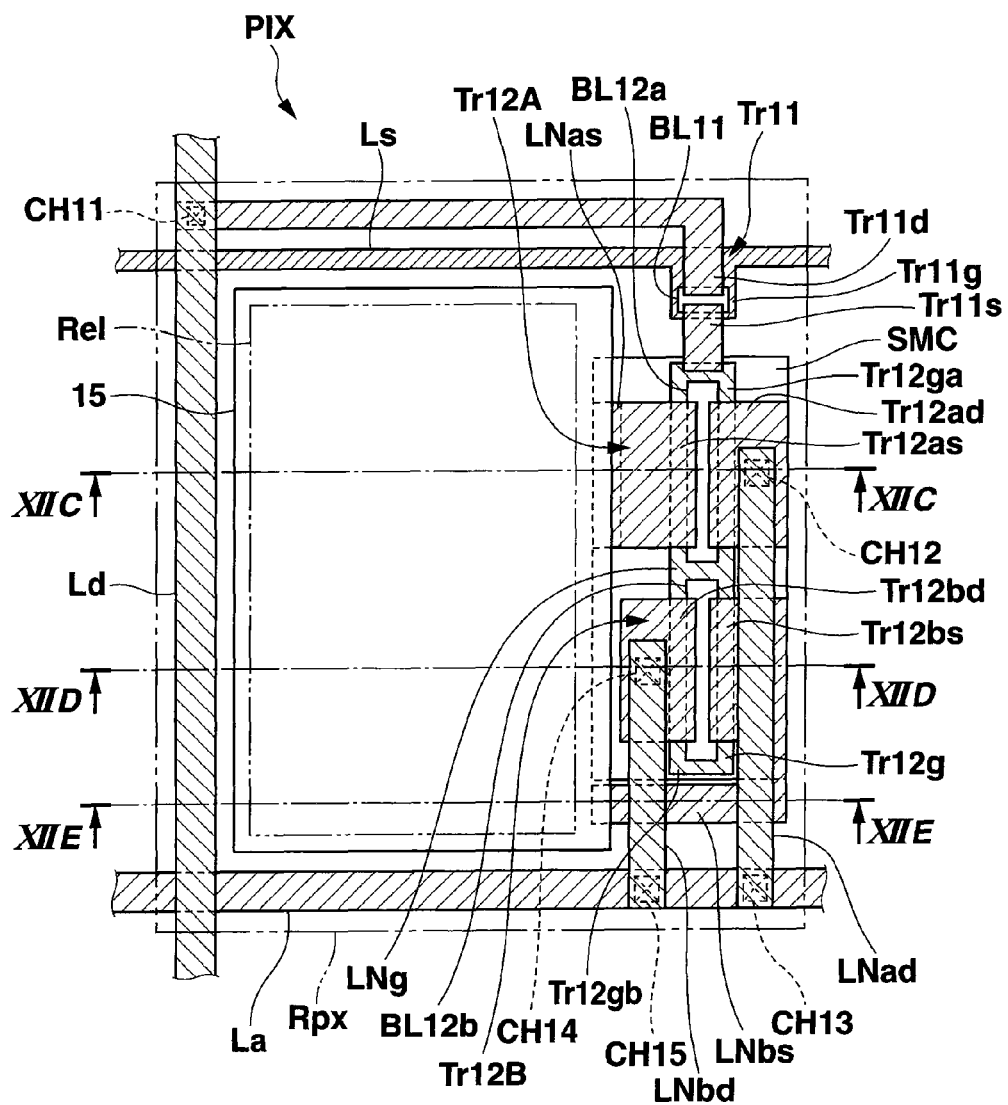
FIG. 12 is a plan layout diagram showing an example of a pixel which is applied in the display apparatus of the first embodiment.

FIG. 12 is a plan layout diagram showing an example of a pixel which is applied in the display apparatus of the embodiment.

FIG. 12 mainly shows the layer in which each of the transistors, wirings and the like of the light emitting drive circuit DC shown in FIG. 11B, and hatchings are carried out for clarifying the electrode of each of the transistors and each of the wiring layers for descriptive purpose. Here, the electrodes and the wiring layers to which the same hatching is carried out are provided in the same layer. Further, wiring layers provided in the same layer means that the wiring layers are formed by the same material at the same time in one layer such as the insulating film or the like, for example, and the layer structure on the lower layer side of the wiring layer does not need to be the same.

Figure 13A:
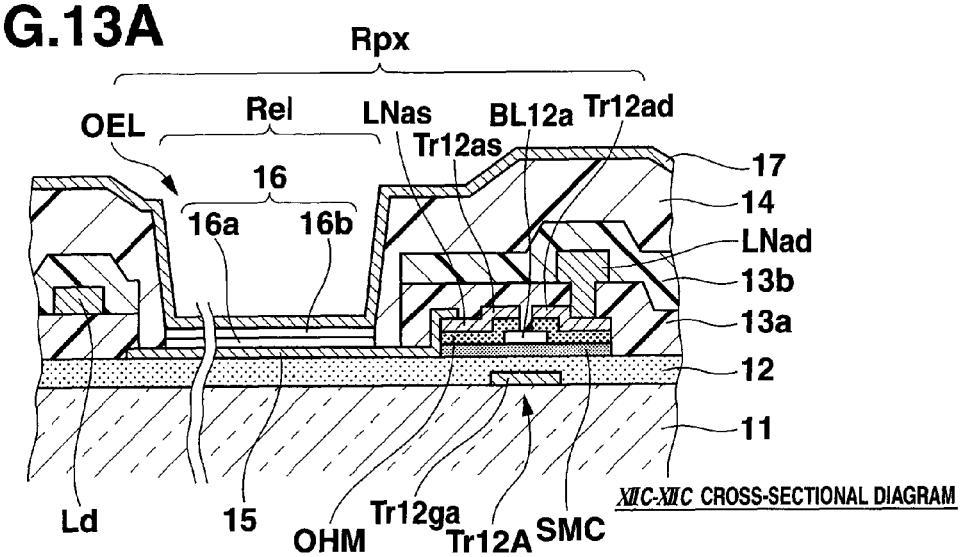
FIG. 13A is a main part cross-sectional diagram of the pixel which is applied in the display apparatus of the first embodiment.
Figure 13B:
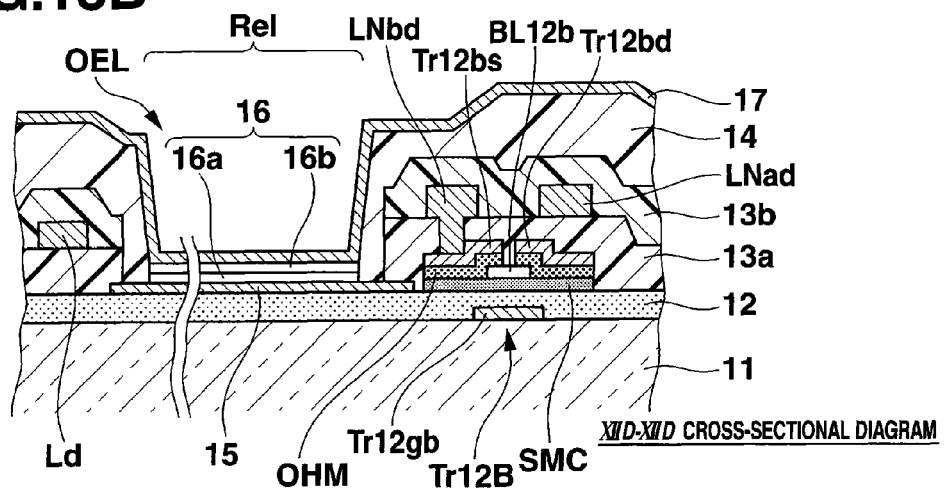
FIG. 13B is a main part cross-sectional diagram of the pixel which is applied in the display apparatus of the first embodiment.
Figure 13C:
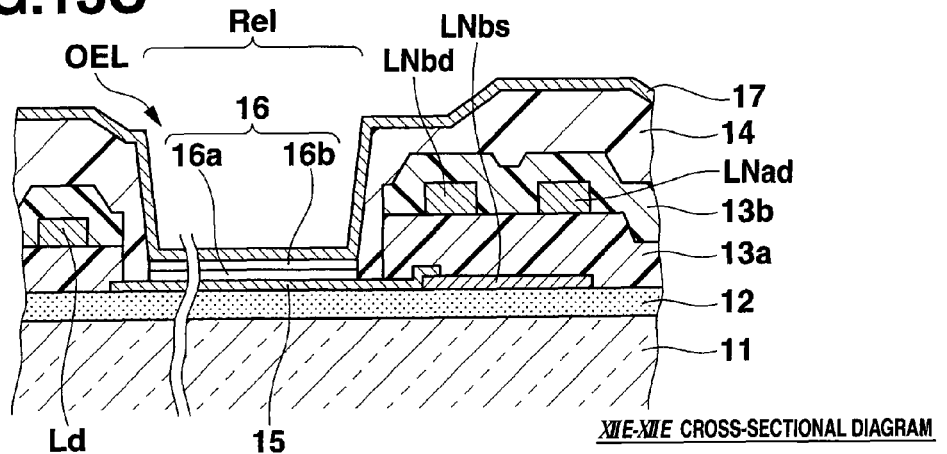
FIG. 13C is a main part cross-sectional diagram of the pixel which is applied in the display apparatus of the first embodiment.

FIGS. 13A to 13C show main part cross-section diagrams of the pixel which is applied in the display apparatus of the embodiment.

FIGS. 13A to 13C show cross-sections cut along the line XIIC-XIIC to XIIE-XIIE (in the specification, "XII" is used as a symbol corresponding to the roman numeral "12" shown in FIG. 12 for descriptive purpose) in the pixel having the plan layout shown in FIG. 12.

In particular, as shown in FIGS. 12, 13A to 13C, the pixel PIX shown in FIG. 11B is provided in each pixel forming region Rpx which is set on one surface side (upper surface side in FIG. 13) of the insulating substrate 11 which is transparent such as a glass or the like.

In the pixel PIX shown in FIG. 12, the select line Ls and the power line La are disposed in the row direction (right-left direction in the drawing) at margins on the upper side and the lower side of the drawing of the pixel forming region Rpx, respectively. On the other hand, the data line Ld is disposed in the line direction (up-down direction in the drawing) at the margin on the left side in the drawing of the pixel forming region Rpx so as to be orthogonal to the select line Ls and the power line La. Further, in the pixel PIX shown in FIG. 12, a partition layer 14 in which an opening is provided at the EL device forming region Rel in the pixel forming region Rpx is provided as shown in FIGS. 13A to 13C, for example.

For example, as shown in FIG. 12, the select line Ls is provided more to the lower layer side (to the substrate 11 side) than the data line Ld and the power line La. Here, the select line Ls is formed of a conductor layer which is provided in the same layer as the layer of the gate electrode Tr11g of the transistor Tr11.

The data line Ld is provided more to the upper layer side than the power line La as shown in FIGS. 12 and 13A to 13C, for example. Here, the data line Ld is connected to the drain electrode Tr11d of the transistor Tr11 via the contact hole CH11.

The power line La is provided more to the lower layer side than the data line Ld as shown in FIGS. 12 and 13A to 13C, for example. The power line La is formed of a conductor layer which is provided in the same layer as the layer of the source electrode Tr12bs of the Tr12B, for example. The power line La is separately connected to the pull-out wirings LNad, LNbd via the contact holes CH13, CH15, respectively.

The transistor Tr11 has the thin film transistor structure of the well known inverted-stagger structure, and as shown in FIG. 12, the gate electrode Tr11g is integrally formed with the select line Ls, the drain electrode Tr11d is connected to the data line Ld via the contact hole CH11 and the drain electrode Tr11d is connected to the gate electrode Tr12g which is commonly used for the transistors Tr12A and Tr12B.

Here, in FIG. 12, the BL 11 is the channel protecting layer.

Moreover, the transistors Tr12A and Tr12B have the same device structure as the thin film transistors TrA and TrB, respectively, which constitute the transistor TFT shown in the above described configuration example.

As shown in FIGS. 12 and 13A to 13C, the transistors Tr12A and Tr12B are provided so as to commonly use the gate electrode Tr12g which is formed of a single conductor layer. In particular, the gate electrode Tr12g includes the first gate electrode Tr12ga of the transistor Tr12A, the second gate electrode Tr12gb of the transistor Tr12B and the gate connecting wiring LNg. The first gate electrode Tr12ga is arranged so as to face the channel protecting layer BLa of the transistor Tr12A, and the gate insulating film 12 and the semiconductor layer SMC are being sandwiched by the first gate electrode Tr12ga and the channel protecting layer BLa. The second gate electrode Tr12gb is arranged so as to face the channel protecting layer BLb of the transistor Tr12B, and the gate insulating film 12 and the semiconductor layer SMC are being sandwiched by the second gate electrode Tr12gb and the channel protecting layer BLb. The gate connecting wiring LNg is disposed at the region extending between the transistors Tr12A and Tr12B. The first gate electrode Tr12ga, the second gate electrode Tr12gb and the gate connecting wiring LNg are connected so as to form a seamless whole. The first gate electrode Tr12ga, the second gate electrode Tr12gb and the gate connecting wiring LNg are integrally formed. The first gate electrode Tr12ga, the second gate electrode Tr12gb and the gate connecting wiring LNg are integrated to form the gate electrode Tr12g.

The drain electrodes Tr12ad and Tr12bd are individually connected to the pull-out wirings LNad and LNbd via the contact holes CH12 and CH14, respectively, and the pull-out wirings LNad and LNbd communicate with each other via the power line La.

The pull-out wirings LNad and LNbd are provided at positions except a region overlapped with the gate electrode Tr12g of the transistors Tr12A and Tr12B in a planar view. For example, the pull-out wirings LNad and LNbd are formed of a conductor layer which is provided in the same layer as the layer of the data line Ld.

The source electrodes Tr12as and Tr12bs are commonly connected to the pixel electrode 15 of the organic EL device OEL via the pull-out wirings LNas and LNbs, respectively, the pull out wirings LNas and LNbs being formed of a conductor layer provided in the same layer as the layer of the source electrodes Tr12as and Tr12bs.

The pull-out wirings LNas and LNbs are provided at positions except a region overlapped with the gate electrode Tr12g of the transistors Tr12A and Tr12B in a planar view.

Here, in FIG. 12, the BL 12a and the BL 12b are channel protecting layers.

The transistor Tr11, the transistors Tr12A and Tr12B are covered with the inter-layer insulating layer 13a and the protection insulation layer 13b.

Here, the pull-out wirings LNas and LNbs and the pixel electrode 15 correspond to the source connecting wiring LNs in the above described configuration example, and the pull-out wirings LNad and LNbd and the power line La correspond to the drain connecting wiring LNd in the above described configuration example.

As shown in FIGS. 12 and 13A to 13C, the organic EL device OEL has the device structure in which the pixel electrode (anode electrode) 15, the organic EL layer (light emitting function layer) 16 and the counter electrode (cathode electrode) 17 are sequentially layered.

Here, in the embodiment, because the organic EL device OEL has the bottom emission type light emitting structure, the pixel electrode 15 is formed with transparent electrode material such as tin doped indium oxide (ITO) or the like. On the other hand, the counter electrode 17 is formed by including electrode material having high light reflection ratio such as simple aluminum, aluminum alloy or the like.

As shown in FIGS. 12 and 13A to 13C, the organic EL layer 16 is provided on the pixel electrode 15 which is exposed in the EL device forming region Rel defined by the opening provided in the partition layer 14. The organic EL layer 16 is formed of a hole injection layer (or a hole transporting layer) 16a and an electron transporting light emitting layer 16b, for example. The counter electrode 17 is formed by a single electrode layer (solid electrode) so as to commonly face the pixel electrodes 15 of the pixels PIX which are arranged on the substrate 11.

As described above, in the pixel PIX of the embodiment, the source electrode Tr12as of the transistor Tr12A and the source electrode Tr12bs of the transistor Tr12B which become the drive transistor are electrically connected to the pixel electrode 15 via the pull-out wirings LNas and LNbs formed of a conductor layer provided in the same layer as the layer of the source electrode Tr12as and Tr12bs.

Further, the drain electrode Tr12ad of the transistor Tr12A and the drain electrode Tr12bd of the transistor Tr12B are connected to the pull-out wirings LNad and LNbd, respectively. Furthermore, the pull-out wirings LNas and LNbd are electrically connected to each other via the power line La.

That is, the drive transistor applied in the pixel PIX of the embodiment has the device structure in which the transistors Tr12A and Tr12B are connected in parallel and the gate electrode Tr12g formed of a single conductor layer is used for both of the transistors Tr12A and Tr12B.

Here, the pull-put wirings LNad and LNbd are formed of a conductor layer provided in the same layer as the layer of the data line Ld and are disposed in the upper layer of the drain electrodes Tr12ad and Tr12bd so as to overlap in a plane.

Further, the pull-out wirings LNad, LNbd, LNas and LNbs are provided at positions except a region overlapped with the gate electrode Tr12g of the transistors Tr12A and Tr12B.

Therefore, in the embodiment, because the semiconductor device (transistor) of the present invention can be applied as the drive transistors of the pixels PIX, variation in the ON currents of the transistors due to the misalignment of the source electrodes and the drain electrodes can be suppressed and the increase in the parasitic capacity and the influence of the top-gate effect due to the connecting wiring can be suppressed. Thus, a display apparatus which has a good display image quality and which can improve the product yield can be realized.

Moreover, in the above described device structure of the drive transistor constituted of the transistors Tr12A and Tr12B, the drain electrodes Tr12ad and Tr12bd are connected to each other via the pull-out wirings LNad and LNbd, respectively, which are formed in the layer different from the layer of the drain electrodes Tr12ad and Tr12bd. In such way, the drain electrodes Tr12ad and Tr12bd and the pull-out wirings LNad and LNbd can be arranged so as to overlap with each other in a plane.

Therefore, the connecting region (in this case, the region in source-drain direction) for disposing wirings for connecting the source electrodes and the drain electrodes at outside of the transistor forming regions can be reduced or eliminated. Thus, the opening ratio of the pixel can be maintained or improved.

Second Embodiment

Next, the second embodiment of the display apparatus in which the light emitting devices of the present invention are applied will be described with reference to the drawings.

Figure 14A:
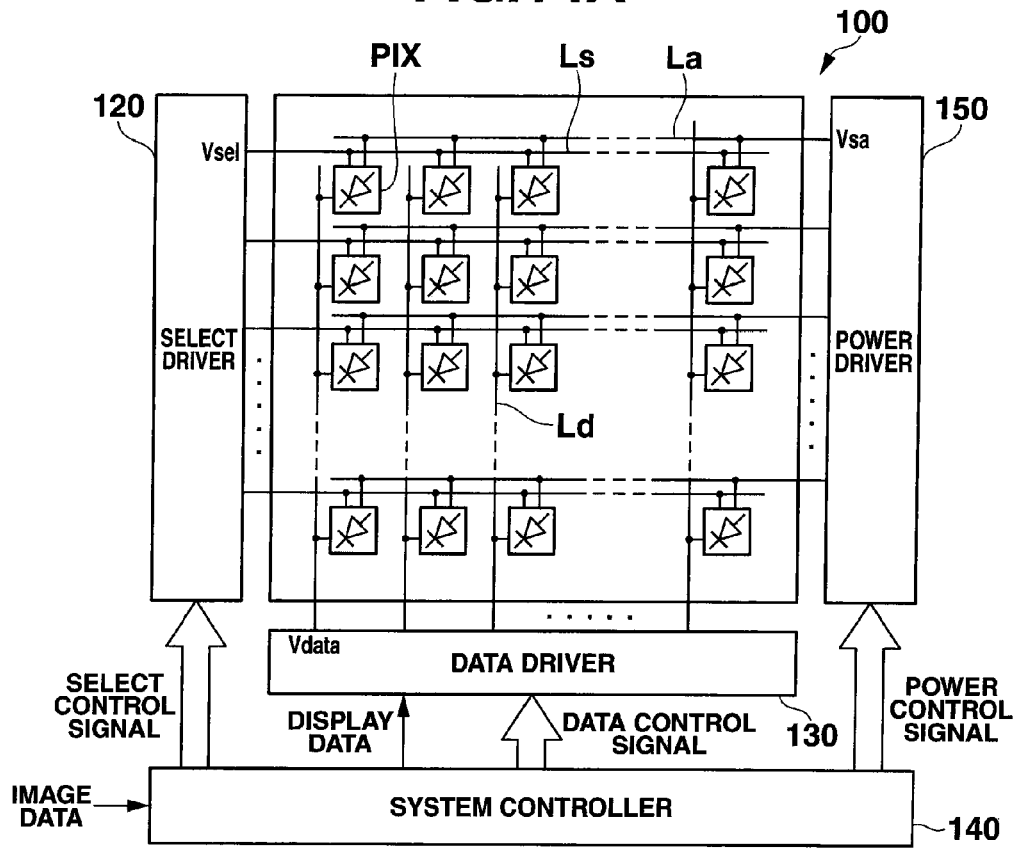
FIG. 14A is a schematic block diagram showing the second embodiment of the display apparatus in which the semiconductor devices of the present invention are applied.
Figure 14B:
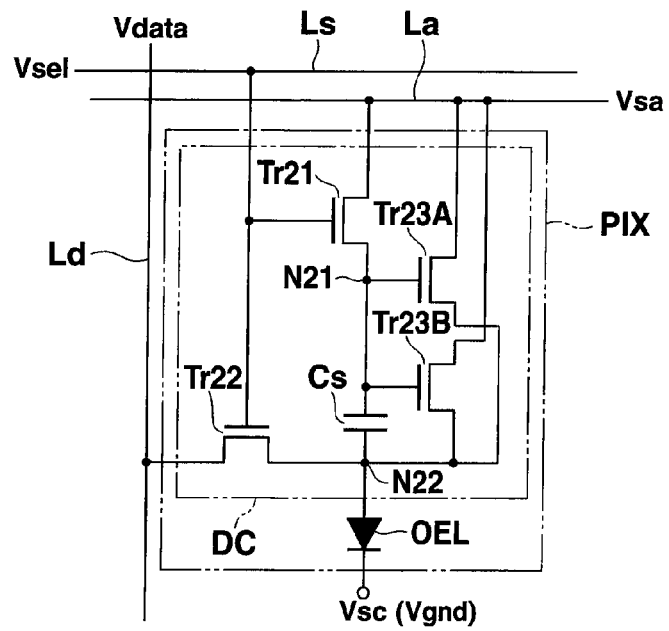
FIG. 14B is a diagram of an equivalent circuit showing the second embodiment of the display apparatus in which the semiconductor devices of the present invention are applied.

FIGS. 14A and 14B are schematic configuration diagrams showing the second embodiment of the display apparatus in which the semiconductor devices of the present invention are applied.

FIG. 14A is a schematic block diagram showing the display apparatus of the embodiment.

FIG. 14B is a diagram of an equivalent circuit of a pixel which is applied in the display apparatus of the embodiment.

Here, as for the structures similar to that of the above described first embodiment, the same or similar symbols as used and the descriptions are simplified.

As shown in FIG. 14A, the display apparatus 100 of the second embodiment has a structure in which the power driver 150 is included in the structure shown in the first embodiment.

Further, similarly to the above described first embodiment, each of the pixels PIX which are arranged in the display panel 110 of the embodiment includes the light emitting drive circuit DC and the organic EL device OEL as shown in FIG. 14B, for example.

The light emitting drive circuit DC includes transistors Tr21 and Tr22, transistors Tr23A and Tr23B and a capacitor Cs as shown in FIG. 14B, for example.

As for the transistor (select transistor) Tr21, the gate terminal is connected to the select line Ls, the drain terminal is connected to the power line La and the source terminal is connected to the contact point N21.

As for the transistor (select transistor) Tr22, the gate terminal is connected to the select line Ls, the source terminal is connected to the data line Ld and the drain terminal is connected to the contact point N22.

As for the transistors (drive transistors) Tr23A and Tr23B, the gate terminal is connected to the contact point N21, the drain terminal is connected to the power line La and the source terminal is connected to the contact point N22, respectively.

The capacitor Cs is provided by being connected to the contact point N21 and the contact point N22.

The power line La connected to the pixel PIX is arranged in the row direction (left-right direction in FIG. 14A) of the display panel 110 and is connected to the power driver 150.

Moreover, in the organic EL device OEL, an anode (a plus electrode; a pixel electrode which becomes an anode electrode) is connected to the contact point N22 of the light emitting drive circuit DC, a cathode (a minus electrode; a counter electrode which becomes a cathode electrode) is connected to a predetermined low potential power source (reference voltage Vsc; for example, grounding potential Vgnd).

Here, the thin film transistors TrA and TrB having the device structure as shown in the above described configuration example are also applied to the transistors Tr23A and Tr23B in the embodiment.

As for the display drive operation of the display apparatus which include the pixels PIX having the above circuit structure, first, in the selecting period, a tone voltage Vdata of minus voltage value according to image data is applied to the data like Ld in a state where a select voltage Vsel at the select level (high level) is applied to the select line Ls and a power voltage Vsa of the non-light emitting level (voltage level of the reference voltage Vsc or lower; for example, minus voltage) is applied to the power line La (select state). Thereby, a potential according to a tone voltage Vdata is applied to the contact point N22 via the transistor Tr22.

In such way, a writing current according to the potential difference occurred between the date electrodes and the source electrodes of the transistors Tr23A and Tr23B flows in a data line Ld direction from the power line La via the transistors Tr23A and Tr23B and the transistor Tr22. At this time, charge according to the potential difference occurred between the contact points N21 and N22 is accumulated in the capacitor Cs.

Here, the potential which is applied to the anode (contact point N22) of the organic EL device OEL is lower than the potential (reference voltage Vsc) of the cathode. Therefore, current does not flow to the organic EL device OEL and the organic EL device OEL does not emit light (non-light emitting operation).

Next, in the non-selecting period after the selecting period is finished, the transistors Tr21 and Tr22 are made to be in the OFF operation state by applying a select voltage Vsel at the non-select level (low level) to the select line Ls (non-select state). At this time, the charge which is accumulated during the selecting period is maintained in the capacitor Cs. Therefore, the transistors Tr23A and Tr23B maintain the ON state.

Further, by applying the power voltage Vsa at the light emitting level (voltage level higher than the reference voltage Vsc) to the power line La, the light emitting drive current which is about the same as the writing current flows to the organic EL device OEL from the power line La via the transistors Tr23A and Tr23B.

In such way, the organic EL device OEL of each pixel PIX emits light at a luminance tone according to image data (tone voltage Vdata) which is written at the time of writing operation, and the desired image information is displayed in the display panel 110.

As described above, the transistor of the present invention can also be applied to the transistors Tr23A and Tr23B which are the drive transistor of the pixel PIX in the embodiment similarly to the above described first embodiment. Thereby, the variation in the ON currents of the transistors caused by the misalignment of the source electrodes and the drain electrodes can be suppressed and the increase in the parasitic capacity and the influence of the top-gate effect due to the connection wirings can be suppressed. Thus, a display apparatus which has a good display image quality and which can improve the product yield can be realized.

Here, as for the particular device structure (plan layout and cross-sectional structure) of the pixel PIX which is applied to the display apparatus of the embodiment, the description will be omitted. However, the structure shown in the above described first embodiment can be preferably applied.

Further, in the above described each embodiment, the case in which the pixel having the organic EL device is applied as the light emitting drive circuit for carrying of the light emitting drive is described. However, the present invention is not limited to this.

That is, the present invention can be preferably applied to any structure as long as the structure includes the pixels arranged on the substrate includes each of which including a light emitting device or a display device and a switching device (thin film transistor) for driving the light emitting device or the display device. For example, the present invention can be applied to a display panel such as a liquid crystal display panel and the like which displays image information by other display methods, for example.

<Application Example to an Electronic Device>

Next, an electronic device in which the light emitting apparatus (display apparatus) including the semiconductor devices (transistors) of the present invention is applied will be described with reference to the drawings.

The above described display device 100 including the display panel 110 and the drive driver (select driver 120, data driver 130 and power driver 150) can be preferably applied as a display apparatus for various types of electronic devices such as a digital camera, a flat-screen television, a personal computer, a cellular phone and the like.

Figure 15A:
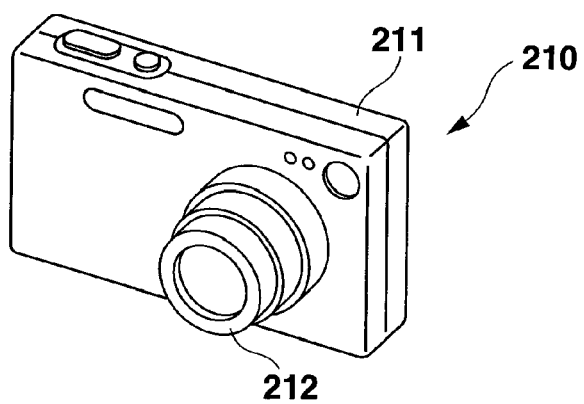
FIG. 15A is a schematic diagram showing a configuration example of a digital camera in which the light emitting apparatus of the present invention is applied.
Figure 15B:
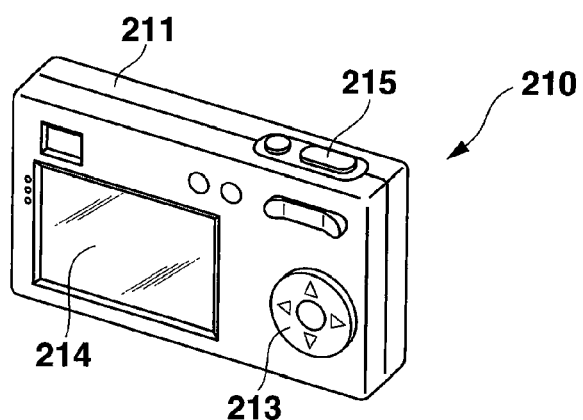
FIG. 15B is a schematic diagram showing the configuration example of the digital camera in which the light emitting apparatus of the present invention is applied.

FIGS. 15A and 15B are schematic diagrams showing a configuration example of a digital camera in which the light emitting apparatus of the present invention is applied.

Figure 16:
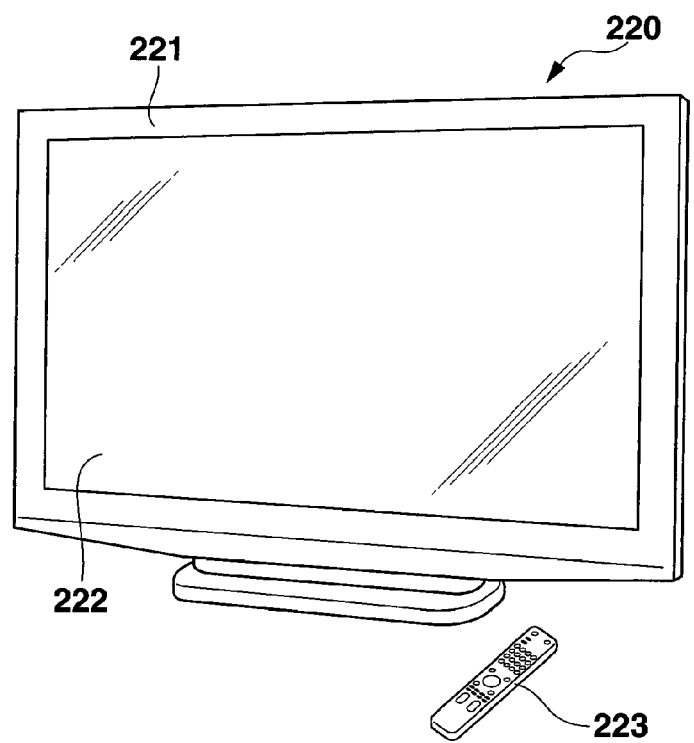
FIG. 16 is a schematic diagram showing a configuration example of a flat-screen television in which the light emitting apparatus of the present invention is applied.

FIG. 16 is a schematic diagram showing a configuration example of a flat-screen television in which the light emitting apparatus of the present invention is applied.

Figure 17:
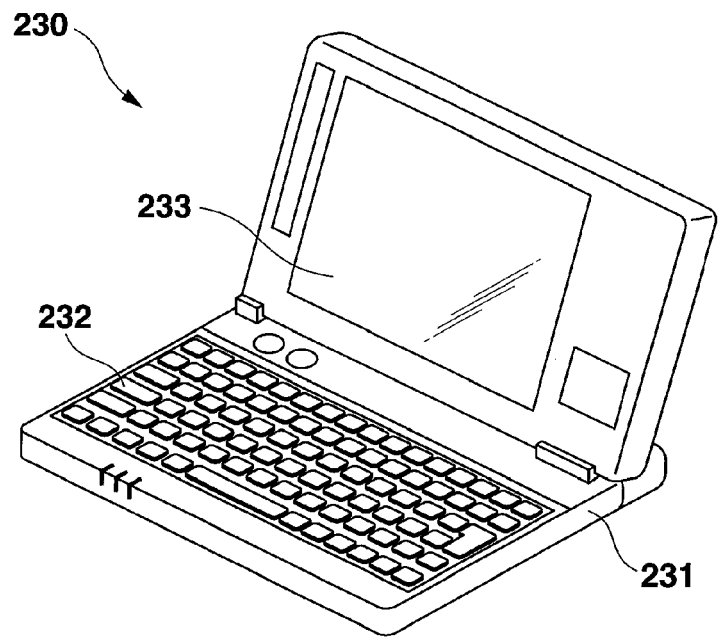
FIG. 17 is a schematic diagram showing a configuration example of a personal computer in which the light emitting apparatus of the present invention is applied.

FIG. 17 is a schematic diagram showing a configuration example of a personal computer in which the light emitting apparatus of the present invention is applied.

Figure 18:
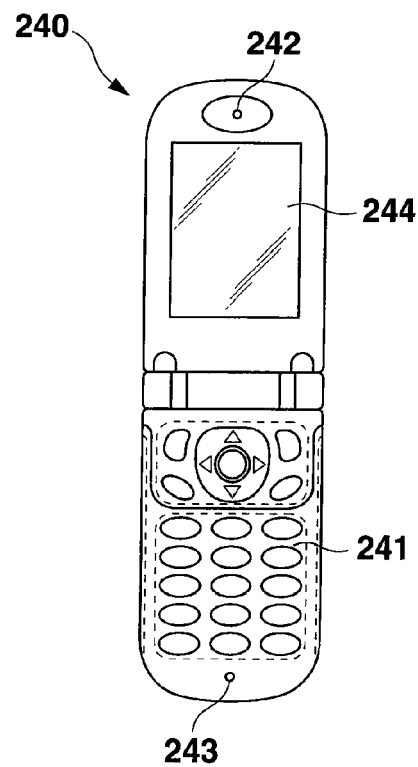
FIG. 18 is a diagram showing a configuration example of a cellular phone in which the light emitting apparatus of the present invention is applied.

FIG. 18 is a diagram showing a configuration example of a cellular phone in which the light emitting apparatus of the present invention is applied.

In FIGS. 15A and 15B, the digital camera 210 roughly includes a main body 211, a lens unit 121, an operation unit 213, a display unit 214 to which the display apparatus 100 provided with the semiconductor devices shown in the above described embodiment is applied and the shutter button 215. According to the digital camera 210, the characteristic variation in the ON currents of the drive transistors of the pixels in the display unit 214 can be suppressed, and the product yield can be improved and a good display image quality can be realized.

Further, in FIG. 16, the flat-screen television 220 roughly includes a main body 221, a display unit 222 to which the display apparatus 100 provided with the semiconductor devices shown in the above described embodiment is applied and an operation controller (remote controller) 223. According to the flat-screen television 220, the characteristic variation in the ON currents of the drive transistors of the pixels in the display unit 222 can be suppressed, and the product yield can be improved and a good display image quality can be realized.

Furthermore, in FIG. 17, the personal computer 230 roughly includes a main body 231 and a key board 232, a display unit 232 to which the display apparatus 100 provided with the semiconductor devices shown in the above described embodiment is applied. Also in the case of the personal computer 230, the characteristic variation in the ON currents of the drive transistors of the pixels in the display unit 233 can be suppressed, and the product yield can be improved and a good display image quality can be realized.

Moreover, in FIG. 18, the cellular phone 240 roughly includes an operation unit 241, an ear piece 242, a mouth piece 243 and a display unit 244 to which the display apparatus 100 provided with the semiconductor devices shown in the above described embodiment is applied. Also in the case of the cellular phone 240, the characteristic variation in the ON currents of the drive transistors of the pixels in the display unit 233 can be suppressed, and the product yield can be improved and a good display image quality can be realized.

Here, in the above described various types of electronic devices, the case in which the light emitting apparatus provided with the semiconductor devices of the present invention is applied as the display apparatus is described. However, the present invention is not limited to such case.

For example, the light emitting apparatus including the semiconductor devices of the present invention may be applied to an exposure apparatus including the light emitting device allay in which a plurality of pixels each of which having the light emitting device are arranged in one direction and which exposes by irradiating the light which is emitted from the light emitting device allay according to image data to a photosensitive drum.

What is claimed is:
1. A semiconductor device, comprising:
a substrate;
a first transistor which is provided on an upper surface of the substrate and which comprises a first source electrode, a first drain electrode and a first gate electrode;
a second transistor which is provided on the upper surface of the substrate and which comprises a second source electrode, a second drain electrode and a second gate electrode, wherein the second transistor is of a same conductive type as the first transistor;
a source connecting wiring which electrically connects the first source electrode and the second source electrode;
a drain connecting wiring which electrically connects the first drain electrode and the second drain electrode; and
a gate connecting wiring which electrically connects the first gate electrode and the second gate electrode,
wherein the first source electrode and the first drain electrode are arranged along a first direction and the second source electrode and the second drain electrode are arranged along the first direction in a reverse order from an order of the first source electrode and the first drain electrode along the first direction,
wherein the source connecting wiring and the drain connecting wiring are provided at positions except a region overlapped with the first gate electrode, the second gate electrode and the gate connecting wiring, and
wherein one of the source connecting wiring and the drain connecting wiring includes a region which overlaps planarly with the other of the source connecting wiring and the drain connecting wiring via an insulation film.

2. The semiconductor device according to claim 1, wherein the first transistor and the second transistor are provided on the substrate so as to be adjacent to each other along a second direction orthogonal to the first direction, and
wherein the first gate electrode, the second gate electrode and the gate connecting wiring are formed as a single conductor layer formed in one layer on the substrate.

3. The semiconductor device according to claim 1, wherein one of the source connecting wiring and the drain connecting wiring comprises a first connecting wiring and a second connecting wiring that is provided in a layer different from a layer in which the first connecting wiring is provided and that is electrically connected to the first connecting wiring, and
wherein other of the source connecting wiring and the drain connecting wiring comprises a third connecting wiring which is provided, via an insulating film, in a layer different from one of the layer in which the first connecting wiring is provided and the layer in which the second connecting wiring is provided.

4. The semiconductor device according to claim 3, wherein the first connecting wiring is a conductor layer provided in the same layer as the first source electrode and the second source electrode or the same layer as the first drain electrode and the second drain electrode,
wherein the second connecting wiring is a conductor layer provided on a lower layer side of the layer of the first source electrode and the second source electrode or the layer of the first drain electrode and the second drain electrode via the insulating film, and
wherein the third connecting wiring is a conductor layer provided in the same layer as the first source electrode and the second source electrode or the same layer as the first drain electrode and the second drain electrode.

5. The semiconductor device according to claim 4, wherein the first transistor and the second transistor are thin film transistors having an inverted-stagger structure, and the second connecting wiring is the conductor layer provided in the same layer as the first gate electrode and the second gate electrode.

6. The semiconductor device according to claim 3, wherein the first connecting wiring is a conductor layer provided on an upper layer side of a layer of the first source electrode and the second source electrode or a layer of the first drain electrode and the second drain electrode, and
wherein the third connecting wiring is a conductor layer provided in the same layer as the first source electrode and the second source electrode or the same layer as the first drain electrode and the second drain electrode.

7. The semiconductor device according to claim 1, wherein the first transistor and the second transistor are thin film transistors having an inverted-stagger structure.

8. A light emitting apparatus comprising a plurality of pixels arranged on a substrate, wherein each of the plurality of pixels comprises a light emitting device and a drive device which is connected to the light emitting device to drive the light emitting device, wherein the drive device comprises:
a first transistor which is provided on an upper surface of the substrate and which comprises a first source electrode, a first drain electrode and a first gate electrode;
a second transistor which is provided on the upper surface of the substrate and which comprises a second source electrode, a second drain electrode and a second gate electrode, wherein the second transistor is of a same conductive type as the first transistor;
a source connecting wiring which electrically connects the first source electrode and the second source electrode;
a drain connecting wiring which electrically connects the first drain electrode and the second drain electrode; and
a gate connecting wiring which electrically connects the first gate electrode and the second gate electrode,
wherein the first source electrode and the first drain electrode are arranged along a first direction and the second source electrode and the second drain electrode are arranged along the first direction in a reverse order from an order of the first source electrode and the first drain electrode along the first direction,
wherein the source connecting wiring and the drain connecting wiring are provided at positions except a region overlapped with the first gate electrode, the second gate electrode and the gate connecting wiring, and
wherein one of the source connecting wiring and the drain connecting wiring includes a region which overlaps planarly with the other of the source connecting wiring and the drain connecting wiring via an insulation film.

9. The light emitting apparatus according to claim 8, wherein the first transistor and the second transistor are provided on the substrate so as to be adjacent to each other along a second direction orthogonal to the first direction, and
wherein the first gate electrode, the second gate electrode and the gate connecting wiring are formed as a single conductor layer formed in one layer on the substrate.

10. The light emitting apparatus according to claim 8, wherein one of the source connecting wiring and the drain connecting wiring comprises a first connecting wiring and a second connecting wiring that is provided in a layer different from a layer in which the first connecting wiring is provided and that is electrically connected to the first connecting wiring, and
wherein the other of the source connecting wiring and the drain connecting wiring comprises a third connecting wiring which is provided, via an insulating film, in a layer different from one of the layer in which the first connecting wiring is provided and the layer in which the second connecting wiring is provided.

11. The light emitting apparatus according to claim 10, wherein the first connecting wiring is a conductor layer provided in the same layer as the first source electrode and the second source electrode or in the same layer as the first drain electrode and the second drain electrode,
wherein the second connecting wiring is a conductor layer provided on a lower layer side of the layer of the first source electrode and the second source electrode or the layer of the first drain electrode and the second drain electrode via the insulating film, and
wherein the third connecting wiring is a conductor layer provided in the same layer as the first source electrode and the second source electrode or the same as the layer as the first drain electrode and the second drain electrode.

12. The light emitting apparatus according to claim 11, wherein the first transistor and the second transistor are thin film transistors having an inverted-stagger structure, and
wherein the second connecting wiring is a conductor layer provided in the same layer as the first gate electrode and the second gate electrode.

13. The light emitting apparatus according to claim 10, wherein the first connecting wiring is a conductor layer provided on an upper layer side of a layer of the first source electrode and the second source electrode or a layer of the first drain electrode and the second drain electrode, and
wherein the third connecting wiring is a conductor layer provided in the same layer as the first source electrode and the second source electrode or the same layer as the first drain electrode and the second drain electrode.

14. The light emitting apparatus according to claim 13, further comprising a plurality of data lines provided on the substrate to supply a drive signal to each of the plurality of pixels by being respectively connected to each of the plurality of pixels,
wherein the first connecting wiring is the conductor layer provided in the same layer as the data lines.

15. The light emitting apparatus according to claim 14, further comprising a plurality of power lines to supply a drive voltage to each of the plurality of pixels, the power lines being provided more on a lower layer side than the data lines and respectively being connected to each of the plurality of pixels,
wherein the second connecting wiring is the power lines.

16. The light emitting apparatus according to claim 8, wherein the light emitting device is an organic electro luminescence device.

17. An electronic device, comprising:
an electronic device main body; and
a light emitting apparatus to which image data is supplied from the electronic device main body and which is driven according to the image data,
wherein the light emitting apparatus comprises a substrate and a plurality of pixels arranged on an upper surface of the substrate,
wherein each of the plurality of pixels comprises a light emitting device and a drive device which drives the light emitting device, the drive device comprising:
a first transistor which is provided on the upper surface of the substrate and which comprises a first source electrode, a first drain electrode and a first gate electrode;
a second transistor which is provided on the upper surface of the substrate and which comprises a second source electrode, a second drain electrode and a second gate electrode, wherein the second transistor is of a same conductive type as the first transistor;
a source connecting wiring which electrically connects the first source electrode and the second source electrode;
a drain connecting wiring which electrically connects the first drain electrode and the second drain electrode; and a gate connecting wiring which electrically connects the first gate electrode and the second gate electrode, wherein the first source electrode and the first drain electrode are arranged along a first direction and the second source electrode and the second drain electrode are arranged along the first direction in a reverse order of an order of the first source electrode and the first drain electrode along the first direction, wherein the source connecting wiring and the drain connecting wiring are provided at positions except a region overlapped with the first gate electrode, the second gate electrode and the gate connecting wiring, and wherein one of the source connecting wiring and the drain connecting wiring includes a region which overlaps planarly with the other of the source connecting wiring and the drain connecting wiring via an insulation film.

18. The electronic device according to claim 17, wherein the first transistor and the second transistor are provided on the substrate so as to be adjacent to each other along a second direction orthogonal to the first direction, and wherein the first gate electrode, the second gate electrode and the gate connecting wiring are formed as a single conductor layer formed in one layer on the substrate.

19. The electronic device according to claim 17, wherein one of the source connecting wiring and the drain connecting wiring comprises a first connecting wiring and a second connecting wiring whish that is provided in a layer different from a layer in which the first connecting wiring is provided and that is electrically connected to the first connecting wiring, and wherein the other of the source connecting wiring and the drain connecting wiring comprises a third connecting wiring which is provided, via an insulating film, in a layer different from one of the layer in which the first connecting wiring is provided and the layer in which the second connecting wiring is provided.

\* \* \* \* \*